US009852913B2

(12) United States Patent
Mayer et al.

(10) Patent No.: US 9,852,913 B2
(45) Date of Patent: Dec. 26, 2017

(54) WETTING PRETREATMENT FOR ENHANCED DAMASCENE METAL FILLING

(71) Applicant: Novellus Systems, Inc., Fremont, CA (US)

(72) Inventors: Steven T. Mayer, Lake Oswego, OR (US); David W. Porter, Sherwood, OR (US); Mark J. Willey, Portland, OR (US)

(73) Assignee: Novellus Systems, Inc., Fremont, CA (US)

( * ) Notice: Subject to any disclaimer, the term of this patent is extended or adjusted under 35 U.S.C. 154(b) by 365 days.

(21) Appl. No.: 14/593,676

(22) Filed: Jan. 9, 2015

(65) Prior Publication Data
US 2015/0179458 A1    Jun. 25, 2015

Related U.S. Application Data

(62) Division of application No. 12/684,787, filed on Jan. 8, 2010, now Pat. No. 8,962,085.

(60) Provisional application No. 61/218,024, filed on Jun. 17, 2009.

(51) Int. Cl.
| C23C 28/00 | (2006.01) |
| H01L 21/288 | (2006.01) |
| H01L 21/768 | (2006.01) |
| C25D 7/12 | (2006.01) |
| C25D 5/02 | (2006.01) |
| C25D 17/00 | (2006.01) |
| C25D 21/04 | (2006.01) |
| C25D 5/00 | (2006.01) |

(Continued)

(52) U.S. Cl.
CPC .......... *H01L 21/2885* (2013.01); *C25D 5/003* (2013.01); *C25D 5/02* (2013.01); *C25D 5/34* (2013.01); *C25D 7/123* (2013.01); *C25D 17/001* (2013.01); *C25D 21/04* (2013.01); *H01L 21/76861* (2013.01); *C25D 3/38* (2013.01)

(58) Field of Classification Search
CPC ..................................................... C23C 28/00
USPC ......................................................... 205/183
See application file for complete search history.

(56) References Cited

U.S. PATENT DOCUMENTS

| 1,255,395 A | 2/1918 | Duram |
| 3,360,248 A | 12/1967 | Lindeman et al. |
| 3,849,002 A | 11/1974 | Hach |

(Continued)

FOREIGN PATENT DOCUMENTS

| CN | 101504911 A | 8/2009 |
| CN | 102286760 A | 12/2011 |

(Continued)

OTHER PUBLICATIONS

U.S. Notice of Allowance dated Feb. 17, 2017, issued in U.S. Appl. No. 14/102,239.

(Continued)

*Primary Examiner* — Edna Wong
(74) *Attorney, Agent, or Firm* — Weaver Austin Villeneuve & Sampson LLP

(57) ABSTRACT

Disclosed are pre-wetting apparatus designs and methods. These apparatus designs and methods are used to pre-wet a wafer prior to plating a metal on the surface of the wafer. Disclosed compositions of the pre-wetting fluid prevent corrosion of a seed layer on the wafer and also improve the filling rates of features on the wafer.

11 Claims, 14 Drawing Sheets

(51) Int. Cl.
*C25D 5/34* (2006.01)
*C25D 3/38* (2006.01)

(56) References Cited

U.S. PATENT DOCUMENTS

| | | |
|---|---|---|
| 4,101,919 A | 7/1978 | Ammann |
| 4,229,191 A | 10/1980 | Moore |
| 4,297,217 A | 10/1981 | Hines et al. |
| 4,816,081 A | 3/1989 | Mehta et al. |
| 5,000,827 A | 3/1991 | Schuster et al. |
| 5,221,449 A | 6/1993 | Colgan et al. |
| 5,281,485 A | 1/1994 | Colgan et al. |
| 5,427,674 A | 6/1995 | Langenskiold et al. |
| 5,482,611 A | 1/1996 | Helmer et al. |
| 5,555,234 A | 9/1996 | Sugimoto |
| 5,800,626 A | 9/1998 | Cohen et al. |
| 5,831,727 A | 11/1998 | Stream |
| 5,982,762 A | 11/1999 | Anzai et al. |
| 5,985,762 A | 11/1999 | Geffken et al. |
| 6,004,470 A | 12/1999 | Abril |
| 6,017,437 A | 1/2000 | Ting et al. |
| 6,074,544 A | 6/2000 | Reid et al. |
| 6,099,702 A | 8/2000 | Reid et al. |
| 6,110,346 A | 8/2000 | Reid et al. |
| 6,124,203 A | 9/2000 | Joo et al. |
| 6,126,798 A | 10/2000 | Reid et al. |
| 6,139,712 A | 10/2000 | Patton et al. |
| 6,156,167 A | 12/2000 | Patton et al. |
| 6,159,354 A | 12/2000 | Contolini et al. |
| 6,162,344 A | 12/2000 | Reid et al. |
| 6,179,973 B1 | 1/2001 | Lai et al. |
| 6,179,983 B1 | 1/2001 | Reid et al. |
| 6,193,854 B1 | 2/2001 | Lai et al. |
| 6,193,859 B1 | 2/2001 | Contolini et al. |
| 6,217,716 B1 | 4/2001 | Fai Lai |
| 6,221,757 B1 | 4/2001 | Schmidbauer et al. |
| 6,251,242 B1 | 6/2001 | Fu et al. |
| 6,261,433 B1 | 7/2001 | Landau |
| 6,274,008 B1 | 8/2001 | Gopalraja et al. |
| 6,277,249 B1 | 8/2001 | Gopalraja et al. |
| 6,333,275 B1 | 12/2001 | Mayer et al. |
| 6,413,388 B1 | 7/2002 | Uzoh et al. |
| 6,503,376 B2 | 1/2003 | Toyoda et al. |
| 6,540,899 B2 | 4/2003 | Keigler |
| 6,544,585 B1 | 4/2003 | Kuriyama et al. |
| 6,551,487 B1 | 4/2003 | Reid et al. |
| 6,582,578 B1 | 6/2003 | Dordi et al. |
| 6,596,148 B1 | 7/2003 | Belongia et al. |
| 6,689,257 B2 | 2/2004 | Mishima et al. |
| 6,716,332 B1 | 4/2004 | Yoshioka |
| 6,753,250 B1 | 6/2004 | Hill et al. |
| 6,800,187 B1 | 10/2004 | Reid et al. |
| 6,964,740 B2 | 11/2005 | Morse et al. |
| 6,964,792 B1 | 11/2005 | Mayer et al. |
| 7,014,679 B2 | 3/2006 | Parekh et al. |
| 7,097,410 B2 | 8/2006 | Reid et al. |
| 7,270,734 B1 | 9/2007 | Schetty, III et al. |
| 7,670,950 B2 | 3/2010 | Richardson et al. |
| 7,686,927 B1 | 3/2010 | Reid et al. |
| 7,771,662 B2 | 8/2010 | Pressman et al. |
| 8,404,095 B2 | 3/2013 | Perkins et al. |
| 8,795,480 B2 | 8/2014 | Mayer et al. |
| 8,962,085 B2 | 2/2015 | Mayer et al. |
| 9,028,666 B2 | 5/2015 | Ranjan et al. |
| 9,138,784 B2 | 9/2015 | Hawkins et al. |
| 9,435,049 B2 | 9/2016 | Thorum |
| 9,455,139 B2 | 9/2016 | Buckalew et al. |
| 9,481,942 B2 | 11/2016 | Zhou et al. |
| 9,613,833 B2 | 4/2017 | Chua et al. |
| 9,617,648 B2 | 4/2017 | Thorum et al. |
| 9,677,188 B2 | 6/2017 | Stowell et al. |
| 9,721,800 B2 | 8/2017 | Mayer et al. |
| 2001/0035346 A1 | 11/2001 | Maeda |
| 2002/0027080 A1 | 3/2002 | Yoshioka et al. |
| 2002/0029973 A1 | 3/2002 | Maydan |
| 2002/0084183 A1 | 7/2002 | Hanson et al. |
| 2002/0084189 A1 | 7/2002 | Wang et al. |
| 2002/0195352 A1 | 12/2002 | Mayer et al. |
| 2003/0116439 A1 | 6/2003 | Seo et al. |
| 2004/0084315 A1 | 5/2004 | Mizohata et al. |
| 2004/0188257 A1 | 9/2004 | Klocke et al. |
| 2004/0198190 A1* | 10/2004 | Basol .................... B24B 37/042 451/41 |
| 2004/0200725 A1 | 10/2004 | Yahalom et al. |
| 2004/0231794 A1 | 11/2004 | Hongo et al. |
| 2004/0262165 A1 | 12/2004 | Kanda et al. |
| 2005/0008786 A1 | 1/2005 | Dubin et al. |
| 2005/0026455 A1 | 2/2005 | Hamada et al. |
| 2005/0145482 A1 | 7/2005 | Suzuki et al. |
| 2005/0255414 A1 | 11/2005 | Inabe et al. |
| 2006/0065536 A1 | 3/2006 | Jentz et al. |
| 2006/0102485 A1 | 5/2006 | Nakano et al. |
| 2006/0141157 A1 | 6/2006 | Sekimoto et al. |
| 2006/0266393 A1 | 11/2006 | Verhaverbeke et al. |
| 2007/0235343 A1* | 10/2007 | Watkowski ............... C25D 3/38 205/291 |
| 2008/0041423 A1 | 2/2008 | Hardikar et al. |
| 2008/0149487 A1 | 6/2008 | Lee |
| 2008/0200018 A1 | 8/2008 | Kawamoto |
| 2009/0151754 A1 | 6/2009 | Zhu et al. |
| 2009/0183992 A1 | 7/2009 | Fredenberg et al. |
| 2010/0032310 A1 | 2/2010 | Reid et al. |
| 2010/0044236 A1 | 2/2010 | Mayer et al. |
| 2010/0084275 A1 | 4/2010 | Hanafusa |
| 2010/0116672 A1 | 5/2010 | Mayer et al. |
| 2010/0163078 A1 | 7/2010 | Hsu et al. |
| 2010/0200960 A1 | 8/2010 | Angyal et al. |
| 2010/0247761 A1 | 9/2010 | Hashimoto |
| 2010/0320081 A1 | 12/2010 | Mayer et al. |
| 2010/0320609 A1 | 12/2010 | Mayer et al. |
| 2011/0043239 A1 | 2/2011 | Tomita et al. |
| 2011/0284386 A1 | 11/2011 | Willey et al. |
| 2012/0175263 A1 | 7/2012 | Ganesan et al. |
| 2012/0255864 A1 | 10/2012 | Nagai et al. |
| 2012/0292192 A1 | 11/2012 | Ranjan et al. |
| 2013/0143071 A1 | 6/2013 | Kleinle |
| 2013/0171833 A1 | 7/2013 | Buckalew et al. |
| 2013/0264213 A1 | 10/2013 | Roeger-Goepfert et al. |
| 2014/0097088 A1 | 4/2014 | Stowell et al. |
| 2014/0230860 A1 | 8/2014 | Chua et al. |
| 2015/0096883 A1 | 4/2015 | Mayer et al. |
| 2015/0126030 A1 | 5/2015 | Yang et al. |
| 2015/0140814 A1 | 5/2015 | Thorum |
| 2016/0222535 A1 | 8/2016 | Zhou et al. |
| 2016/0258078 A1 | 9/2016 | Thorum et al. |
| 2016/0281255 A1 | 9/2016 | Buckalew et al. |
| 2017/0148627 A1 | 5/2017 | Chua et al. |

FOREIGN PATENT DOCUMENTS

| | | |
|---|---|---|
| CN | 102677139 A | 9/2012 |
| CN | 102786879 A | 11/2012 |
| CN | 102804343 A | 11/2012 |
| CN | 103305886 A | 9/2013 |
| EP | 0 860 866 | 8/1998 |
| JP | 06151397 A | 5/1994 |
| JP | H07-72357 B2 | 8/1995 |
| JP | 2003-129283 A | 5/2003 |
| JP | 2006-004955 | 1/2006 |
| JP | 2007-138304 | 6/2007 |
| JP | 2009-064599 | 3/2009 |
| KR | 10-1999-0029433 | 4/1999 |
| KR | 10-2001-0052062 | 6/2001 |
| KR | 10-2004-0020882 | 3/2004 |
| KR | 10-2007-0071097 A | 7/2007 |
| TW | 483040 B | 4/2002 |
| TW | 200716793 | 5/2007 |
| TW | I281516 | 5/2007 |
| TW | 201109481 A1 | 3/2011 |
| WO | WO 99/10566 | 3/1999 |
| WO | WO 99/41434 | 8/1999 |
| WO | WO 01/68952 | 9/2001 |
| WO | WO 02/062446 | 8/2002 |

(56) References Cited

FOREIGN PATENT DOCUMENTS

| WO | WO 2007/112768 | 10/2007 |
|---|---|---|
| WO | WO 2010/148147 | 12/2010 |
| WO | WO 2012/022660 | 2/2012 |

OTHER PUBLICATIONS

Chinese Decision of Final Rejection dated Apr. 7, 2017 issued in Application No. CN 201310676660.7.
Taiwan Examination Report dated Mar. 17, 2017 issued in Application No. TW 102145646.
Chinese Second Office Action dated Feb. 22, 2017 issued in Application No. CN 201410658497.6.
Chinese First Office Action dated Apr. 5, 2017 issued in Application No. CN 201510239529.3.
U.S. Appl. No. 15/424,198, filed Feb. 3, 2017, Chua et al.
U.S. Appl. No. 14/085,262, filed Nov. 20, 2013, entitled "Alkaline Pretreatment for Electroplating".
U.S. Appl. No. 14/613,306, filed Feb. 3, 2015, entitled "Geometry and Process Optimization for Ultra-High RPM Plating".
U.S. Appl. No. 09/872,340, filed May 31, 2001, entitled "Methods and Apparatus for Bubble Removal in Wafer Wet Processing".
U.S. Appl. No. 14/326,899, filed Jul. 9, 2014, entitled "Apparatus for Wetting Pretreatment for Enhanced Damascene Metal Filling".
U.S. Appl. No. 12/961,274, filed Dec. 6, 2010 entitled "Deionized Water Conditioning System and Methods".
U.S. Appl. No. 13/460,423, filed Apr. 30, 2012, titled "Wetting Wave Front Control for Reduced Air Entrapment During Wafer Entry Into Electroplating Bath."
U.S. Final Office Action, dated Aug. 31, 2005, issued in U.S. Appl. No. 09/872,340.
U.S. Office Action, dated Apr. 14, 2005, issued in U.S. Appl. No. 09/872,340.
U.S. Office Action, dated Jan. 18, 2006, issued in U.S. Appl. No. 09/872,340.
U.S. Office Action, dated May 26, 2006, issued in U.S. Appl. No. 09/872,340.
U.S. Office Action, dated Nov. 8, 2006, issued in U.S. Appl. No. 09/872,340.
U.S. Final Office Action, dated Mar. 14, 2007, issued in U.S. Appl. No. 09/872,340.
U.S. Office Action, dated Jun. 27, 2012 in U.S. Appl. No. 12/684,787.
U.S. Office Action, dated Apr. 8, 2013 in U.S. Appl. No. 12/684,787.
U.S. Final Office Action, dated Jul. 24, 2013 in U.S. Appl. No. 12/684,787.
U.S. Office Action, dated Oct. 29, 2013 in U.S. Appl. No. 12/684,787.
U.S. Final Office Action, dated Mar. 3, 2014 in U.S. Appl. No. 12/684,787.
U.S. Office Action, dated Aug. 26, 2014 in U.S. Appl. No. 12/684,787.
U.S. Notice of Allowance, dated Oct. 10, 2014 in U.S. Appl. No. 12/684,787.
U.S. Notice of Allowance (Supplemental Notice of Allowability), dated Oct. 22, 2014 in U.S. Appl. No. 12/684,787.
U.S. Notice of Allowance (Supplemental Notice of Allowability), dated Oct. 28, 2014 in U.S. Appl. No. 12/684,787.
U.S. Office Action, dated Apr. 12, 2011, issued in U.S. Appl. No. 12/684,792.
U.S. Final Office Action, dated Jul. 26, 2011, issued in U.S. Appl. No. 12/684,792.
U.S. Office Action, dated Sep. 27, 2013, issued in U.S. Appl. No. 12/684,792.
U.S. Final Office Action, dated Apr. 10, 2014, issued in U.S. Appl. No. 12/684,792.
U.S. Office Action, dated Jun. 6, 2013, issued in U.S. Appl. No. 12/961,274.
U.S. Final Office Action, dated Oct. 28, 2013, issued in U.S. Appl. No. 12/961,274.
U.S. Notice of Allowance, dated Jan. 21, 2014, issued in U.S. Appl. No. 12/961,274.
U.S. Office Action, dated Jul. 25, 2014, issued in U.S. Appl. No. 12/961,274.
U.S. Final Office Action, dated Nov. 28, 2014, issued in U.S. Appl. No. 12/961,274.
PCT International Search Report and Witten Opinion, dated Jan. 5, 2011, issued in PCT/US2010/038901.
PCT International Preliminary Report on Patentability and Written Opinion dated Jan. 5, 2012, issued in PCT/US2010/038901.
Chinese First Office Action dated Aug. 14, 2014 issued in CN Application No. 201080026847.7.
Korean Office Action, dated Jan. 5, 2012 in KR Application No. 2010-7026340.
Taiwan Office Action dated Nov. 18, 2014 issued in TW Application No. 099119625.
U.S. Office Action, dated Sep. 19, 2016, issued in U.S. Appl. No. 14/102,239.
U.S. Office Action, dated Nov. 12, 2015, issued in U.S. Appl. No. 14/182,767.
U.S. Office Action, dated May 20, 2016, issued in U.S. Appl. No. 14/182,767.
U.S. Notice of Allowance, dated Nov. 25, 2016, issued in U.S. Appl. No. 14/182,767.
U.S. Office Action, dated Jun. 5, 2015, issued in U.S. Appl. No. 14/085,262.
U.S. Final Office Action, dated Oct. 23, 2015, issued in U.S. Appl. No. 14/085,262.
U.S. Notice of Allowance, dated May 3, 2016, issued in U.S. Appl. No. 14/085,262.
U.S. Notice of Allowance, dated Jun. 23, 2016, issued in U.S. Appl. No. 14/613,306.
U.S. Notice of Allowability, dated Oct. 12, 2016, issued in U.S. Appl. No. 14/613,306.
U.S. Office Action, dated Feb. 5, 2016, issued in U.S. Appl. No. 14/638,750.
U.S. Office Action, dated Aug. 10, 2016, issued in U.S. Appl. No. 14/638,750.
U.S. Notice of Allowance, dated Dec. 21, 2016 issued in U.S. Appl. No. 14/638,750.
U.S. Office Action, dated Oct. 23, 2015, issued in U.S. Appl. No. 14/326,899.
U.S. Notice of Allowance, dated May 6, 2016, issued in U.S. Appl. No. 14/326,899.
U.S. Notice of Allowance, dated Aug. 26, 2016, issued in U.S. Appl. No. 14/326,899.
U.S. Office Action, dated Jul. 29, 2015, issued in U.S. Appl. No. 13/775,987.
U.S. Notice of Allowance, dated Mar. 14, 2016, issued in U.S. Appl. No. 13/775,987.
U.S. Notice of Allowance (Corrected Notice of Allowability), dated Apr. 26, 2016, issued in U.S. Appl. No. 13/775,987.
U.S. Notice of Allowance (Corrected Notice of Allowability), dated Jun. 17, 2016, issued in U.S. Appl. No. 13/775,987.
U.S. Notice of Allowance, dated May 27, 2015, issued in U.S. Appl. No. 12/961,274.
Chinese First Office Action dated Nov. 2, 2015 issued in Application No. CN 201310676660.7.
Chinese Second Office Action dated Jun. 20, 2016 issued in Application No. CN 201310676660.7.
Chinese Third Office Action dated Jan. 5, 2017 issued in Application No. CN 201310676660.7.
Chinese First Office Action dated Aug. 3, 2016 issued in Application No. CN 201410658497.6.
Taiwan Office Action dated Mar. 22, 2016 issued in Application No. TW 104118528.
Taiwan Examination and Search Report dated Oct. 13, 2016 issued in Application No. TW 102108847.
Chinese First Office Action dated Jul. 7, 2016 issued in Application No. CN 201310080545.3.

(56) References Cited

OTHER PUBLICATIONS

Li, Guang et al., (2002) "Quantitative analysis of HBsAg in vaccinum hepatitis B by high performance capillary zone electrophoresis," *Analytical Instrumentation*, Issue 1, pp. 21-23 [Abstract Only].
U.S. Notice of Allowance [Corrected Notice of Allowability], dated Jun. 28, 2017, issued in U.S. Appl. No. 14/326,899.
U.S. Notice of Allowance, dated Jul. 5, 2017, issued in U.S. Appl. No. 15/181,150.
Chinese First Office Action dated Jul. 18, 2017 issued in Application No. CN 201610124296.7.

* cited by examiner

| Process | Pext atm | Pdis atm | ω rpm | predegassed fluid |
|---|---|---|---|---|
| A | 1 | 1 | 90 | No |
| B | 0.2 | 1 | 90 | Yes |
| C | 0.2 | 1 | 12 | Yes |
| D | 3 | 1 | 90 | Yes |
| E | 3 | 1 | 12 | Yes |
| F | 1 | 1 | 12 | No |

WETTING PRETREATMENT FOR ENHANCED DAMASCENE METAL FILLING

CROSS-REFERENCE TO RELATED APPLICATIONS

This application is a divisional of and claims priority to U.S. application Ser. No. 12/684,787, filed Jan. 8, 2010 (issued as U.S. Pat. No. 8,962,085 on Feb. 24, 2015), titled "Wetting Pretreatment for Enhanced Damascene Metal Filling" naming Mayer et al. as inventors, which claims benefit under 35 U.S.C. §119(e) to U.S. Provisional Application No. 61/218,024, filed Jun. 17, 2009, which are incorporated herein by reference in their entireties.

FIELD OF THE INVENTION

The embodiments disclosed herein relate to pre-wetting apparatus designs and methods. More specifically, embodiments relate to pre-wetting apparatus designs and methods for pre-wetting a semiconductor wafer prior to depositing electrically conductive materials on the wafer for integrated circuit manufacturing.

BACKGROUND

Wetting is a property of a liquid/solid interface governed by adhesive forces between the liquid and solid and cohesive forces in the liquid. Adhesive forces between the liquid and solid cause the liquid to spread across the solid surface. Cohesive forces in the liquid cause the liquid to minimize contact with the solid surface. The wetting of a solid surface by a liquid is important in many industrial processes where a liquid interacts with a solid surface. Electroplating (a cathodic process), including electroplating in integrated circuit manufacturing, is one such industrial process. Wetting is also important in anodic processes, including eletro-etching and electropolishing.

For example, in integrated circuit manufacturing, a conductive material, such as copper, is often deposited by electroplating onto a seed layer of metal deposited onto the wafer surface by a physical vapor deposition (PVD) or a chemical vapor deposition (CVD) method. Electroplating is a method of choice for depositing metal into the vias and trenches of the wafer during damascene and dual damascene processing.

Damascene processing is a method for forming interconnections on integrated circuits (ICs). It is especially suitable for manufacturing integrated circuits, which employ copper as a conductive material. Damascene processing involves formation of inlaid metal lines in trenches and vias formed in a dielectric layer (inter-metal dielectric). In a typical damascene process, a pattern of trenches and vias is etched in the dielectric layer of a semiconductor wafer substrate. Typically, a thin layer of an adherent metal diffusion-barrier film such as tantalum, tantalum nitride, or a TaN/Ta bilayer is then deposited onto the wafer surface by a PVD method, followed by deposition of an electroplate-able metal seed layer (e.g., copper, nickel, cobalt, ruthenium, etc.) on top of the diffusion-barrier layer. The trenches and vias are then electrofilled with copper, and the surface of the wafer is planarized.

SUMMARY

Disclosed are pre-wetting apparatus designs and methods.

In one embodiment, a method of pre-wetting a wafer substrate prior to electrolytically processing the wafer substrate is disclosed. A wafer substrate having an exposed metal layer on at least a portion of its surface is provided to a pre-wetting process chamber. Then, the pressure in the pre-wetting process chamber is reduced to a subatmospheric pressure. Then, the wafer substrate is contacted with a pre-wetting fluid at a subatmospheric pressure to form a wetting layer on the wafer substrate.

In one embodiment, a method of electroplating a layer of copper on a wafer substrate is disclosed. A wafer substrate having an exposed metal layer on at least a portion of its surface is provided to a pre-wetting process chamber. Then, the wafer substrate is contacted with a pre-wetting fluid to form a layer of pre-wetting fluid on the wafer substrate. The pre-wetting fluid includes water and copper ions and is substantially free of plating additives. Then, the pre-wetted wafer substrate is contacted with a plating solution to electroplate a layer of copper on the wafer substrate. The plating solution includes copper ions and plating additives, with the concentration of copper ions in the pre-wetting fluid being greater than the concentration of copper ions in the plating solution.

In one embodiment, a method of electroplating a layer of metal on a wafer substrate is disclosed. A wafer substrate having an exposed metal layer on at least a portion of its surface is provided to a pre-wetting process chamber. Then, the wafer substrate is contacted with a pre-wetting fluid to form a layer of pre-wetting fluid on the wafer substrate. The pre-wetting fluid includes a water-miscible solvent. Then, the pre-wetted wafer substrate is contacted with a plating solution including metal ions to electroplate a layer of metal on the wafer substrate.

In one embodiment, a method of electroplating a layer of metal on a wafer substrate is disclosed. A wafer substrate having an exposed metal layer on at least a portion of its surface is provided to a pre-wetting process chamber. Then, the pressure in the pre-wetting process chamber is reduced to a subatmospheric pressure. Following the reduction of pressure, the wafer substrate is contacted with a pre-wetting fluid at a subatmospheric pressure to form a layer of pre-wetting fluid on the wafer substrate. The pre-wetting fluid has a pH of between about 2 to 6. Then, the pre-wetted wafer substrate is contacted with a plating solution including metal ions to electroplate a layer of metal on the wafer substrate. The plating solution has a pH of between about 2 to 6. The plating solution and the pre-wetting fluid also have different compositions.

In one embodiment, a method of electroplating a layer of metal on a wafer substrate is disclosed. A wafer substrate having an exposed metal layer on at least a portion of its surface is provided to a pre-wetting process chamber. Then, the wafer substrate is contacted with a pre-wetting fluid to form a layer of pre-wetting fluid on the wafer substrate. The pre-wetting fluid includes a reducing agent to at least partially reduce surface oxide on the exposed metal layer. Then, the pre-wetted wafer substrate is contacted with a plating solution comprising metal ions to electroplate a layer of metal on the wafer substrate.

In one embodiment, a method of electroplating a layer of metal on a wafer substrate is disclosed. A wafer substrate having an exposed metal layer on at least a portion of its surface is provided to a pre-wetting process chamber. Then, the wafer substrate is contacted with a pre-wetting fluid to form a layer of pre-wetting fluid on the wafer substrate. The pre-wetting fluid includes a metal complexing agent to at least partially remove surface oxide from the exposed metal layer. The pre-wetting also has a pH of between about 4 to 12. Then, the pre-wetted wafer substrate is contacted with a plating solution comprising metal ions to electroplate a layer of metal on the wafer substrate.

In another embodiment, a partially fabricated semiconductor device structure is disclosed. The partially fabricated semiconductor device structure includes at least one recessed feature, the recessed feature having a layer of metal substantially lining the feature. The recessed feature includes a substantially gas-free pre-wetting fluid filling the feature. The pre-wetting fluid includes an aqueous metal salt solution substantially free from plating accelerators and levelers.

DETAILED DESCRIPTION

Figure 1:
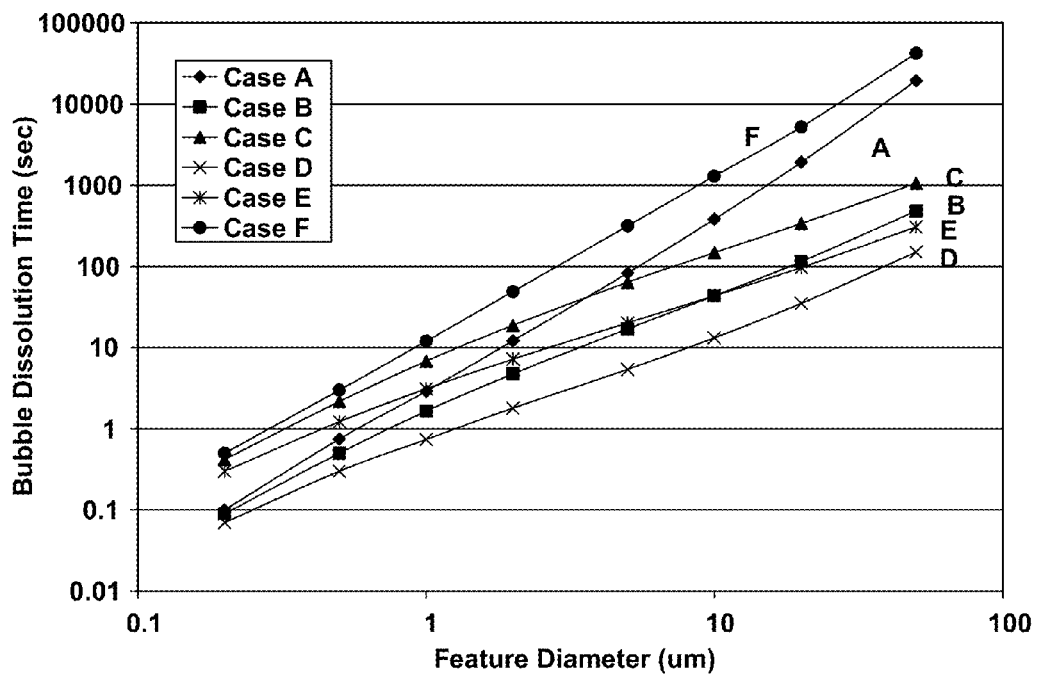
FIG. 1 depicts a plot of bubble dissolution time versus feature size.

Reference will now be made to specific embodiments. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Disclosed herein are apparatus designs and methods for wafer pre-wetting, for modifying the conditions of wafer entry and wafer processing during plating, and pre-wetting fluid compositions. The pre-wetting process, in accordance with embodiments provided herein, can be performed in the electroplating chamber or in a separate pre-wetting station of a module which includes a pre-wetting station and an electroplating station. In some embodiments pre-wetting and electroplating are performed in separate apparatuses.

The substrate typically is a semiconductor wafer which has a layer of conductive material residing thereon (e.g., a seed layer comprising copper or copper alloy). During electroplating, electrical connections are made to the conductive layer and the wafer substrate is negatively biased, thereby serving as a cathode. The wafer is contacted with a plating solution containing a metal salt (e.g., copper sulfate, a copper alkylsulfonate, or a mixture of salts), which is reduced at the wafer cathode resulting in metal deposition on the wafer. In many embodiments, the substrate contains one or more recessed features (e.g., vias and/or trenches), which need to be filled by the electroplating process. The plating solution, in addition to metal salts, may also contain an acid, and typically contains one or more additives such as halides (e.g., chloride, bromide, etc.), accelerators, levelers, and suppressors, used to modulate electrodeposition rates on various surfaces of the substrate.

The disclosed processes and associated apparatus designs are particularly applicable and necessary for electrofilling wider (e.g., typically greater than 5 μm) and deeper (e.g., typically greater than 10 μm) damascene structures (vias), such as those commonly found in emerging copper through silicon via (TSV) electrofill structures. Through silicon via structures are further described in U.S. patent application Ser. No. 12/193,644, filed Aug. 18, 2008, now U.S. Pat. No. 7,776,741, which is herein incorporated by reference. Gas bubbles, trapped or otherwise residing on the surface or within a feature, will interfere with the field and feature plating process either by blocking the feature surface with the non-conducting gas, or by creating an impediment to the free passage of current. The disclosed processes and associated apparatus designs enable void-free copper electrofilling.

Electroplating and electrofill of TSV interconnections present a number of challenges. These include long plating times due to very large and/or deep structures, and formation of side wall voids due to seed layer corrosion reactions with plating electrolyte solutions and due to insufficient coverage of lower sidewalls by PVD-deposited seed layer. Further, it is important to ensure that the interior of all recessed features are filled with liquid and that there are no trapped gasses inside the features that prevents plating therein. It is also advantageous to simultaneously maintain strong wall and field plating growth-suppression while removing plating resistance selectively at the bottom of the feature.

The pre-wetting apparatus designs and methods described herein are generally described with respect to electroplating (a cathodic process) a metal, specifically copper. However, the pre-wetting apparatus designs and methods described herein are generally applicable to all electrolytic processes, including eletroetching and electropolishing, both of which are anodic processes.

Methods for forming liquid-filled bubble-free recessed features that are needed for the plating process are described. Further, compositions of pre-wetting fluids which minimize seed layer corrosion and simultaneously increase plating rates are described.

Introduction

The concentration of dissolved gas at the bubble interface with the liquid is related to internal bubble pressure by Henry's law, one form of which can be expressed as:

$$C_i = x_i H_i P_i \quad (1)$$

where the subscript i depicts "inside" the bubble, $C_i$ is the concentration of a component of dissolved gas molecules in the liquid phase at the bubble interface (e.g., nitrogen, oxygen, etc., each in moles/l), $x_i$ is the mole fraction of that component in the gas phase inside the bubble itself, $H_i$ is the Henry's law constant, and $P_i$ is the pressure inside the bubble. This equation can be written for each molecular component of the gas in a mixture of gases (e.g., one for oxygen, one for nitrogen, etc.). There is a similar expression for the concentration of dissolved gas in the bulk solution, where the subscript b is used to indicate the solution "bulk", for example, with P equal to $P_b$, signifying the gas phase pressure which would be in equilibrium with a concentration of the species in the bulk, $C_b$. Ignoring 2D and 3D dispersion effects, and assuming that the diffusion of gas molecules from within the bubble gas phase to the bubble/liquid surface is not rate limiting (so that an equilibrium condition between the dissolved gas at the bubble interface and the concentration of gas inside the bubble is maintained), a useful approximation for the rate of gas dissolution from the bubble trapped inside a feature can be obtained, expressed as:

$$R = dV/dt = DH(x_i P_i - x_b P_b)/h \quad (2)$$

where V is the bubble gas volume, t is time, D is the diffusion coefficient of the gas in the solution, h is the distance from the top of the trapped bubble to the edge of the boundary layer thickness, which resides at a distance δ above the upper wafer plane, and the subscript b corresponds to conditions in the bulk of the solution at the diffusion boundary layer interface. For a given chemical system at a fixed temperature (constant Henry's law constant and diffusion coefficient), two factors can lead to relatively rapid bubble dissolution: 1) a large concentration difference/driving force $(x_i P_1 - x_b P_b)$; and 2) a short diffusion distance h.

If the value of the driving force term $H(x_i P_1 - x_b P_b)$ is zero, the rate of dissolution is zero. Generally, this term is very small. Since the gas within the bubble typically comes from air inside a via in a wafer prior to the pre-wetting process, and the liquid is typically saturated with the same air prior to the pre-wetting process, the mole fraction at the bubble interface and in the bulk solution will initially be the same as that of air (e.g., x=0.21 for oxygen, both in the bubble and in the bulk solution). Therefore, for this situation and in general (i.e., unless other mechanisms are employed to enhance bubble dissolution), it is primarily the natural capillary difference in pressure within the bubble versus outside the bubble that results in bubble dissolution.

Trapped gas held within a small damascene feature (e.g., a via) can exhibit a very large internal pressure, due to strong internal capillary forces. The total internal capillary pressure is proportional to the contact angle and the surface tension, and inversely proportional to radius of curvature of the bubble, $$P_i = P_{ext} + \sigma \cos \theta / r \quad (3)$$

where $P_i$ is the total internal pressure within the bubble, $P_{ext}$ is the external pressure of the fluid (typically about 1 atmosphere), σ is the liquid/gas surface tension, θ is the solid/liquid/gas contact angle, and r is the radius of curvature. Note that the radius of curvature r cannot significantly differ from the feature width, so one can often substitute the radius of the via as an approximation for a bubble's radius of curvature. With a small via, the total internal pressure (and hence the partial pressure of each component) can become very large, exceeding several atmospheres or more. These large internal pressures then drive a non-equilibrium condition with respect to the bulk of the solution, and the bubble interface becomes significantly supersaturated with respect the amount of dissolved gas in the bulk of the solution at the same pressure (i.e., the amount of dissolved gas at the bubble's interface exceeds the gas solubility in the liquid). This satisfies one of the conditions for rapid bubble dissolution. For small vias, the small diffusion distance, "h", also aids in a rapid dissolution rate.

In contrast, large vias with larger radius bubbles have both small excess internal pressure and much larger diffusion distances. Calculation/modeling of the time for complete bubble dissolution for various conditions (i.e., partial pressure of dissolved gas, rotation rate of wafer) as a function of the via depth for vias of a 3:1 aspect ratio (depth to width) with the via initially 50% filled of gas at atmospheric pressure, are shown in FIG. 1. For all of processes shown in FIG. 1, σ=60 dyne/cm (e.g., a value for water), D=1.9E−5 cm²/sec (e.g., a value for air in water), T=20° C., and Vi=50% of a via.

Vi is the initial volume of the bubble, under 1 atmosphere of pressure (i.e., only 50% of each via is filled with a bubble for generating these plots). For the $P_{ext}$=0.2 cases, the pressure on the fluid is still one atmosphere, but the partial pressure of dissolved gas in the bulk of the liquid is only equivalent to that in equilibrium with 0.2 atmospheres of gas pressure. This condition could be achieved, for example, by having a trapped bubble form by flooding the surface with a degassed fluid with a pressure of 0.2 atmospheres while the pressure of gas over the fluid is 1 atmosphere. For the $P_{ext}$=3 cases, the amount of dissolved gas in the liquid is equal to that in equilibrium with 1 atmosphere of pressure, but the pressure on the liquid and bubble is equal to 3 atmospheres of pressure. This condition could be achieved, for example, by having a trapped bubble form by flooding the surface with atmospheric-saturated liquid, and then applying an external pressure over that via/liquid/wafer of 3 atmospheres. In this case, the bubble immediately shrinks in size to ⅓ its original volume.

Comparing curves A and F (non-degassed pre-wetting fluid, with the amount of gas equal to that in equilibrium with 1 atmosphere of air) to curves B and C (a pre-wetting fluid degassed to a partial pressure equal to 0.2 of an atmosphere), the degassed solution cases have a lower bubble dissolution time. Curves F and C are similar by comparison, but the boundary layer thickness and dissolution time are greater because the wafer was rotated at a slower rate (12 rpm versus 90 rpm in A and B).

Curves A and F of FIG. 1 show that the time of dissolution of a bubble inside a via where the solution is saturated with air changes more than 5 orders of magnitude between a via 0.2 μm in size versus 50 μm in size. In small, submicron features, bubbles are unstable and dissolve quickly, but in larger features, bubbles will persist for very long times. For example, calculations indicate that a relatively large front end of the line structure 1 μm in diameter and 4 μm in depth completely filled with gas will have that gas completely dissolved in less than a 4 seconds. In contrast, a 0.25 μm feature, 1 μm deep, is so unstable that it would dissolve in less than 0.4 seconds, and smaller structures essentially dissolve instantaneously. However, both of the favorable factors (i.e., high internal pressure and short diffusion distances) are missing in large TSV scale structures. In contrast, calculations show that it could take over 2 hours for a 25 μm wide, 100 μm deep feature to dissolve. Even if this feature were only filled 10% with gas at its bottom, it would still take 20 minutes or more for that gas to be removed.

Removing gas from the pre-wetting fluid reduces the time to dissolve a trapped bubble. In this case, the right term of the driving force ($x_b P_b$ in equation 2) is diminished by stripping the gas from the solution, for example by reducing the partial pressure of the gas exposed to the pre-wetting fluid in a degassing unit under partial vacuum (i.e., by driving down the magnitude of this product in the gas side of the degassing unit, gas is driven out of the fluid). The gas in the trapped bubble is at approximately 1 atmosphere of pressure or more (when there is significant capillary pressure). At the bubble interface, the concentration of gas will be at near equilibrium with that of the same 1 atmosphere or more or pressure, but in the solution, the concentration as a whole, due to the degassing operation, is at a much lower concentration. This creates a significant concentration driving force and degree of sub-saturation of the gas in the solution (chemical "capacity") to enable rapid dissolving the bubble.

This procedure at first may appear to be appealing, but may suffer from two limitations. First, for large deep vias, the diffusion distance for the gas may still be a significant limiting factor. Second, since the amount of gas in the solution can never be less than zero, the magnitude of the driving force for dissolution is limited to be no more than approximately $Hx_i P$ (P=1 atmosphere). Comparing curves B and C to A and F of FIG. 1, the rate of dissolution of large features (e.g., 50 μm) decreases by a more than one order of magnitude over the non-degassed gas, but the dissolution time is generally still unacceptably long (e.g., at least 5-10 minutes). Note that the rate of dissolution of smaller features are not significantly affected by the use of a degassed solution, because the process is dominated by the large excess internal bubble pressure compared to the increase in 1 atmosphere of dissolve gas driving force.

Figure 2:
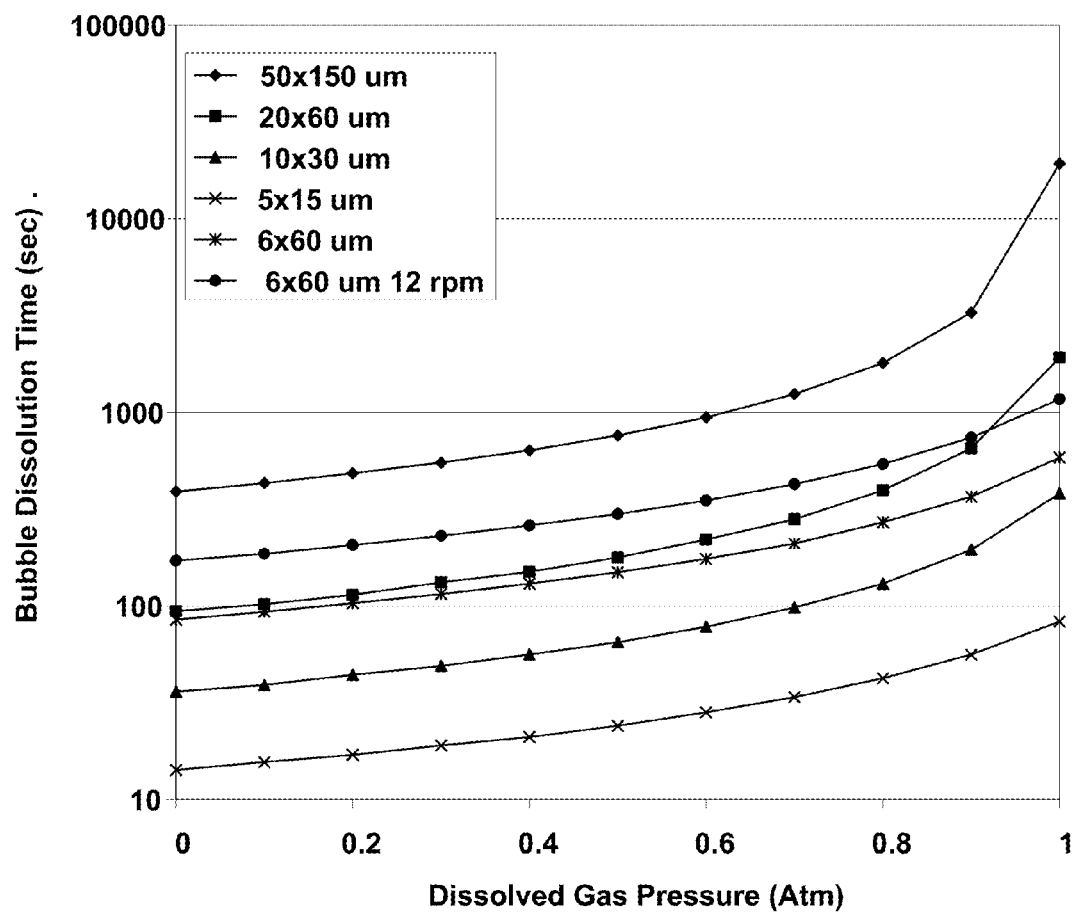
FIG. 2 depicts a plot of bubble dissolution time versus the dissolved gas pressure.

FIG. 2 shows the bubble dissolution time for various feature dimensions (at 90 rpm rotation, 60 dyne/cm), where the amount of dissolved gas is the independent parameter. In each case, the bubble is initially 50% of the via size, and there is an external pressure of 1 atmosphere on the fluid and bubble, though the dissolved partial pressure changes as a function of the x axis. To clarify, in FIG. 2, the concentration of dissolved gas corresponds to the dissolved gas pressure on the x-axis, related by Henry's law. These partial pressure would be obtained, for example, by degassing the contacting fluid to the extent of the x-axis parameter. Bubbles in smaller, less deep features dissolve more quickly, the rate aided by the large internal capillary pressure. Again reducing the partial pressure for smaller features has less of a relative effect on reducing the dissolution time. For larger features (e.g., 50 μm×150 μm), there is diminishing benefit of reducing the partial pressure of dissolved gas below 30 to 40% of the saturated condition. In all but the smallest and most shallow features, the time of dissolution exceeds 100 seconds. Feature depth is a significant limiting factor in all cases, with deep features having long dissolution times.

Apparatus

Generally, the apparatus designs and methods described herein avoid the formation of a bubble within a recessed feature (e.g., a via) on a wafer substrate by first removing gas, primarily all non-condensable gasses (e.g., nitrogen and oxygen), from within the feature before pre-wetting the surface and feature with a fluid. To accomplish this, the wafer with the recessed features is placed in a vessel that is suitable for both holding the wafer and removing the gas from the wafer surfaces (e.g., a vacuum vessel). In addition to the vessel itself, a mechanism for removing the gas (e.g., a line connected to a vacuum source such as a pump) and a mechanism for depositing liquid onto the surface while the vacuum conditions are maintained, are needed.

Described herein are various apparatus designs for pre-wetting a wafer prior to, or within a short time after, the initiation of a plating process, where bubbles and gas that might otherwise be trapped within features recessed in a surface are avoided. Embodiments of a pre-wetting apparatus include various elements. Typically, a pre-wetting apparatus includes a pre-wetting fluid storage and return tank, including liquid mixing devices and liquid level controllers and sensors. In some embodiments, the apparatus includes a pre-wetting fluid degassing flow loop. Such a degassing flow loop includes a circulating pump, routing/diverting valves, a liquid degassing element, and a connection between the liquid degassing element and the system vacuum pump (used to pump down and apply vacuum to various liquid degassing elements on the tool and the pre-wetting chamber), in some embodiments. A pre-wetting apparatus also includes a pre-wetting chamber. A pre-wetting chamber, in some embodiments, includes a two position (open/closed) vacuum wafer access door or lid for access to the chamber and a combined door or lid and splash shield that prevents liquid from hitting and subsequently dropping from the upper walls or door onto the wafer surface. In some embodiments, inside the chamber is a wafer holder for supporting and rotating the wafer within the chamber. In some embodiments, the chamber includes an air-dome chamber-heater, used to prevent liquid condensation on the walls of the chamber that would otherwise reside above the wafer and the vacuum wafer access door and potentially drip onto the wafer. Pre-wetting chambers typically include an inlet port for pre-wetting fluid to enter the chamber and to direct pre-wetting fluid to land on the upper surface of the rotating wafer and an inlet line and chamber port for drawing and releasing vacuum on the chamber, the inlet line containing a particle filtration device and the inlet port containing a flow diffuser configured to disperse incoming gas flow and minimize chamber flow turbulence. In some embodiments, the chamber includes liquid level sensors for monitoring an empty/ready and overflow/over-full condition. Pre-wetting chambers also typically include a drain for removing liquid from the chamber and directing the drained fluid back to the storage tank.

Embodiments described herein overcome the deleterious effects of trapped bubbles, particular those bubbles which can be formed in larger vias or trenches in a wafer, by: (1) avoiding trapping gas in the via during pre-wetting altogether by removing substantially all of the atmospheric non-condensable gasses above the wafer and from within the via, and then pre-wetting the wafer with pre-wetting fluid; and/or (2) significantly increasing the rate a bubble will dissolve by applying a large external pressure on the fluid, thereby driving the bubble to dissolve in the fluid by creating a large supersaturated condition at the bubble interface. In addition to these pre-treating and pre-plating measures, in some embodiments plating is performed in a plating solution that is maintained in a degassed state, and in other embodiments, the plating solution is degassed in the line just prior to being exposed to the wafer surface.

In some embodiments it is possible to perform pre-wetting within an electroplating cell, where the pre-wetting fluid has the same composition as the plating solution.

However, for a variety of reasons, including the hardware complexity of combining plating processes with vacuum processes, pre-wetting (including vacuum feature-backfilled pre-wetting) is often performed in a different cell, sub-cell, or module than the plating cell. When pre-wetting under vacuum is performed in a distinctly different area of the plating cell, or in a distinctly separate module from the plating cell, rather than in the plating solution, the composition of the pre-wetting fluid can be selected. The pre-wetting fluid may have the same, or very similar, composition as that subsequently used for plating the wafer. The pre-wetting fluid may include all the elements of the plating bath (e.g., the same solvent(s) and same dissolved metal ions, acids, cation, additives and halides, at the same or very similar concentrations as in the plating solution). Such a pre-wetting fluid may work in some embodiments. Alternatively, in other embodiments, a pre-wetting fluid that is very different from the plating solution may be used. For example, in some embodiments, a pre-wetting fluid of 1) water, 2) a fluid with a substantially higher metal ion concentration than that of the plating solution, 3) a fluid having either a lower, different combination of, or no dissolved halides, 4) a fluid substantially free of one, a few, or all of the plating additives, or 5) water-miscible solvents may be used as pre-wetting fluids. Such pre-wetting fluids are further described herein.

A number of factors should be considered when selecting a pre-wetting fluid composition, including the possibilities of: a) corroding the metal layers on a wafer substrate before initiation of plating; b) inhibiting the plating process (i.e., slowing down or inhibiting altogether the feature metal-filling process); c) the loss of pre-wetting fluid to subsequent pre-wetting fluid reuse; and d) altering (by adding, diluting, or concentrating) various critical species concentrations within the plating bath over time. The latter process may alter the metal ion concentrations, halide concentrations, organic additives, etc., in the plating bath. These effects can be quite substantial. Furthermore, when using a pre-wetting fluid of a different composition than the plating bath, performing the pre-wetting process in the same module without enabling suitable mechanisms of removing and recovering excess entrained pre-wetting fluid that would be added to the plating solution would generally require mechanisms for mitigating, monitoring and/or otherwise correcting for plating solution modification over time. On the other hand, the use of hardware and a process wherein the pre-wetting operation is performed in a separate treatment station, module, vessel, or sub-vessel of the plating cell that allows for separation and recovery of this fluid may be advantageous because it can avoid such issues. With this background, and in order to simplify the description of core concepts of embodiments, many embodiments are described hereafter in the context of a separate pre-wetting "station" and a separate "plating station", with the wafer being transferred from the former to the latter. However, while perhaps favorable in some circumstances (e.g., for avoiding mixing of unlike liquids or for other reasons), the aspect of embodiments related to the particular choice of pre-wetting materials, the general fluid, and plating processing sequences are not intended to be so limited.

Figure 3:
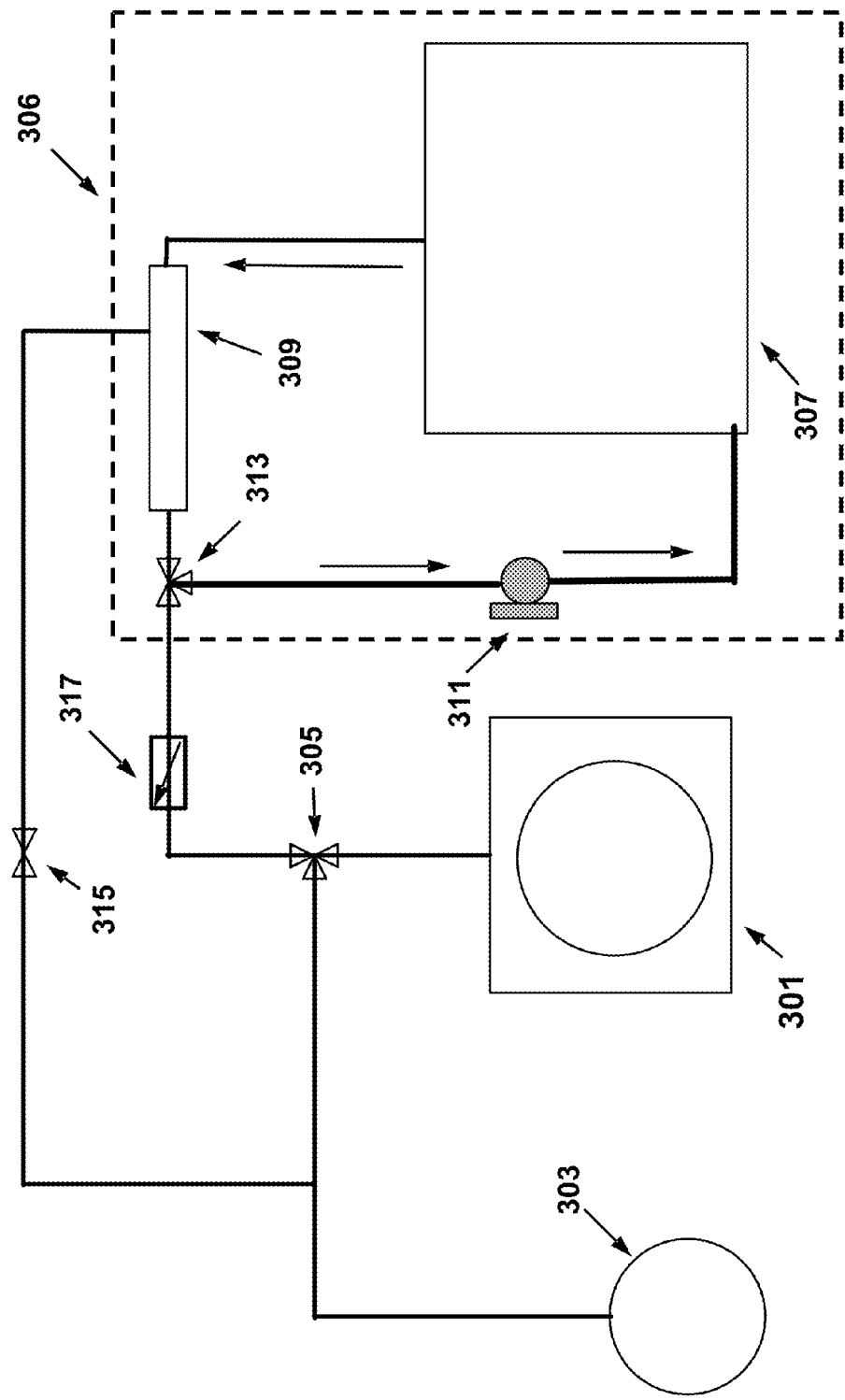
FIG. 3 depicts a schematic layout of one embodiment of a pre-wetting apparatus.

FIG. 3 depicts a schematic layout of one embodiment of a pre-wetting apparatus (i.e., chamber 301 and associated hardware). The chamber 301 is connected to vacuum pump 303 though an outlet in the chamber and through a three-way valve connection 305. On the other side of the three-way valve is degassing loop 306 that includes a pre-wetting fluid tank 307, a degassing device 309, and a pump 311 for circulating the pre-wetting fluid around the degassing loop. In another embodiment, the pre-wetting fluid feed line and the vacuum line are not connected except at the chamber, and each has its own valve (i.e., there is no three-way valve). In an alternative embodiment, the chamber has an inlet for admitting pre-wetting fluid and an outlet adapted for connection with a vacuum pump. The position of the pump 311 can after the degassing element, if it is desired to drive the fluid into the chamber by the pump rather than by being sucked into the chamber by a pressure differential between the pre-wetting fluid tank 307 and the chamber 301.

In some embodiments, the area in the pre-wetting fluid holding tank 307 is purged of gasses by applying a vacuum to the holding tank using a vacuum pump (not shown) so that a minimum amount of dissolved gas is achieved. The rate or removal of the gas from the pre-wetting fluid can also be increased by increasing the exposed surface of the fluid to the vacuum, for example, by having the fluid re-enter the chamber from the circulation loop in a spray or through a spray column. In the embodiment of the system shown in FIG. 3, pre-wetting fluid is circulated though the degassing device 309 (e.g., in some embodiments, a membrane contact degasser) for removing one or more dissolved gases (e.g., both $O_2$ and $N_2$) from the pre-wetting fluid prior to pre-wetting. Examples of commercially available degassing devices include the Liquid-Cel™ from Membrana of Charlotte, N.C. and the pHasor™ from Entegris of Chaska, Minn. The amount of dissolved gas can be monitored with an appropriate meter (e.g., a commercial dissolved oxygen meter (not shown)). The removal of the dissolved gas prior to the pre-wetting fluid entering chamber 301 can improve the pre-wetting process, as is described herein. After degassing the pre-wetting fluid, optionally, the valve 315 between the vacuum side of the degassing chamber 309 and the vacuum pump 303 is closed (this prevents gas initially in the chamber from becoming dissolved in the degassed pre-wetting fluid; in some embodiments, separate pumps can be used for these two functions).

Unlike conditions that exist when using an apparatus similarly configured to that of FIG. 3, if the pre-wetting fluid is not degassed prior to exposing it to a wafer under vacuum, dissolved gas from the fluid can be released from the fluid as it enters the chamber. This results in bubbles forming inside the vias. While not wanting to be limited by a particular model or theory, a via bottom is a location of negative curvature, and it is believed that this location is a particularly susceptible to nucleating a bubble and releasing gas from the pre-wetting fluid. If this occurs, bubbles will be formed from the pre-wetting fluid containing dissolved gas because it is supersaturated with gas under the pre-wetting conditions (e.g., vacuum in the chamber). The bubbles so formed can remain there after the pre-wetting process, which in turn can inhibit plating there and lead to associated defects. Therefore, in some embodiments (including the embodiment shown in FIG. 3), the pre-wetting fluid used in the pre-wetting process is a degassed pre-wetting fluid. In some embodiments, the degassed pre-wetting fluid may be a plating solution, and the pre-wetting methods described herein may be preformed in the same chamber as the plating chamber itself. If a separate pre-wetting chamber and apparatus are employed, but the pre-wetting fluid is not degassed, then intermittent and unreliable filling results may be observed. For example, when vias on a wafer are filled with pre-wetting fluid (with the wafer under vacuum) without first degassing the pre-wetting fluid, it has been found that approximately 15% of the vias still have air bubbles in them (as indicated by the same percentage having post-plating voids, indicative of trapped gas bubble therein). Thus, in some embodiments, it is important to perform pre-wetting under vacuum (i.e., at a subatmospheric pressure) and with a degassed fluid.

In contrast, the use of a degassed pre-wetting fluid in combination with a pre-wetting operation under vacuum (i.e., at subatmospheric pressure) leads, in some embodiments, to significantly fewer feature voids than when pre-wetting under vacuum alone is employed. In specific embodiments that give good protection against forming voids, a combination of a degassed pre-wetting fluid with pre-wetting under vacuum is further combined with plating in a plating solution that is degassed. The plating solution may be degassed only in the initial stages of plating (e.g., for only about the first 10 minutes of the plating process), or remain degassed for the entire plating process (e.g., if the plating time is greater). Experiments performed under these conditions produced vias that were void free.

Returning to FIG. 3, after the pressure in chamber 301 has reached a low value (i.e., a subatmospheric pressure), the three-way valve 305 to the vacuum pump location is switched to connect to the line from the degassing loop 306, and the three-way valve 313 of the degasser loop is set to allow fluid to be directed into the vacuum chamber 301. In some embodiments, the subatmospheric pressure is about equal to that of the boiling pressure of the pre-wetting fluid at the temperature of operations, which for water at ambient temperature is about 20 torr. In other embodiments, the subatmospheric pressure is about 50 torr. In further embodiments, the pressure of 50 torr is maintained while pre-wetting the wafer substrate. In alternative embodiments, the pre-wetting system is configured to initiate introduction of the pre-wetting fluid into the chamber and onto the wafer substrate after the pressure in the chamber has been reduced to less than about 50 Torr. In embodiments where the pre-wetting fluid tank 307 is at atmospheric pressure, liquid is drawn into the chamber 301 by the pressure differential between the vacuum chamber and the pre-wetting fluid tank.

The pre-wetting fluid wets the device side of the wafer surface of a wafer in the chamber 301. Needle valve 317 can be used to meter the flow of the pre-wetting fluid into chamber 301. Embodiments of chamber 301 are described herein. Chamber 301, in some embodiments, is a pressure chamber configured to apply an external pressure to increase the rate of bubble dissolution, as described herein. In further embodiments of a pre-wetting apparatus, the pre-wetting apparatus includes a transfer mechanism configured for transferring the wafer substrate from the pre-wetting chamber to an electroplating apparatus.

In some embodiments, the pre-wetting fluid is cooled prior to injection into the pre-wetting chamber (e.g., 0° C. for water, or −10° C. for suitable electrolytes). In other embodiments, the degasser is configured for cooling the pre-wetting fluid to a temperature of less than about 20° C. Other examples of methods for cooling the pre-wetting fluid include passing the fluid over a heat exchanger in the pre-wetting fluid holding tank or though a in-line cooler (both not shown in FIG. 3). Cooling the pre-wetting fluid reduces the partial vapor pressure of the solvent of the pre-wetting fluid, which allows for greater applied vacuum, for example, to the degassing device. Lowering the temperature of the pre-wetting fluid can also be effective in increasing both the surface tension and viscosity of the pre-wetting fluid, which tends to make the phenomena of degassing device "blow through" or "weeping" less prevalent. Weeping can be a particularly difficult problem when dealing with salt containing pre-wetting fluids, because weeping salt laden fluids tend to dry and destroy the pores of the degassing device. Using lower temperature fluids reduces the tendency of salt laden electrolyte to evaporate and flow, avoiding this known source of degassing device failure. For example, the vapor pressure of water (with a small amount of salt) is about 2.7 torr at −10° C. versus 17.5 torr at 20° C. and 32 torr at 30° C. With a 20 torr vacuum (yielding about 0.5 ppm dissolved atmospheric gas) applied to a degassing device, a 30° C. pre-wetting fluid will literally boil and leave salts around the pores of the degassing device, and a 20° C. pre-wetting fluid will evaporate rapidly. Very little degassing device salting occurs when using a −10° C. pre-wetting fluid, however. Thus, in general, more dissolved gas can be removed more efficiently from a degassing device with a lower temperature fluid. In some embodiments, the pre-wetting fluid is cooled to a temperature of less than 20° C., for example 0° C. or less, while it is degassed and before it enters the processing chamber. Also, reducing the temperature of the pre-wetting fluid reduces the rate of metal corrosion in the pre-wetting system.

In some embodiments of a pre-wetting apparatus, the surface of a wafer is wetted with a pre-wetting fluid followed by the application of an external pressure to the fluid. The wafer surface is first contacted with the fluid using an appropriate mechanism, usually immersing the wafer in a pre-wetting fluid (described herein). In these embodiments, the pre-wetting chamber includes an inlet for admitting pre-wetting fluid and the chamber is configured for operating at a higher than atmospheric pressure during or after pre-wetting. The application of an external pressure to the fluid facilitates the removal of bubbles. In some embodiments, the pre-wetting fluid is preconditioned so that it is substantially free not just of oxygen (e.g., to minimize corrosion of the metal on the wafer), but of all dissolved non-condensable gasses, such as nitrogen and carbon dioxide, prior to the pre-wetting of the surface, to accelerate the dissolution rate of any trapped bubble in a recessed feature. Exposure of a wafer to deoxygenated processing fluid for use in the treatment of a semiconductor wafer is described in U.S. Pat. Nos. 6,021,791 and 6,146,468, which are incorporated herein by reference.

After immersion of the wafer into a pre-wetting fluid or covering of the wafer with a pre-wetting fluid, the region around the wafer (e.g., a pressure chamber) is closed and sealed, and an external pressure is applied to the chamber and fluid. Pressure may be applied pneumatically (e.g., introducing high pressure gas into the chamber in the area over the fluid), or hydraulically (e.g., with the chamber substantially free of non-dissolved gas and using a hydraulic piston or other suitable device to apply external pressure to the fluid). As the pressure in the chamber increases, the bubble will decrease from its original size. When using pneumatic (gas) pressure to compress the trapped bubble, it may be important to avoid dissolving substantial amounts of gas into the pre-wetting fluid, particularly in the vicinity of the bubble. In some embodiments, a stagnant, relatively thick layer of fluid, for example, greater than 1 cm in thickness, is used. In other embodiments, the pneumatic pressure is applied to the chamber though a long tube with a substantial resistance for dissolution of gas from reaching the interface so that the gas that contacts the liquid does so over a relatively small surface area and has a relatively long diffusion path, limiting the amount of gas that can dissolve in the fluid over a period of time. However pressure is applied, the driving force for dissolution of the trapped bubble will increase with applied pressure. For a large bubble without significant capillary pressure effects, the driving force for dissolution will be approximately equal to the product of the initial mole fraction of the particular gas component in the bubble and the difference in applied pressure to the chamber and the initial partial pressure of dissolved gas in the fluid. This later quantity will vary depending on the extent of degassing performed on the pre-wetting fluid.

While pressure can be applied either pneumatically or hydraulically, in pre-wetting embodiments that are not immersion embodiments, but rather coverage of a wafer with a thin layer of pre-wetting fluid, the pneumatically applied external pressure will potentially allow gas to redissolve quickly into a (e.g., degassed) thin layer of pre-wetting fluid. There is a competition between gas uptake from the external pressurized gas source versus gas dissolution into the liquid from the bubble. Therefore, a relatively thick layer of pre-wetting fluid should be used for non-immersion pre-wetting operations. Also, there are a limited number of practical mechanisms for applying hydrostatic pressure to the thin layer of pre-wetting fluid on a wafer. One possible mechanism for doing so is to create a face-up wafer and a pre-wetting liquid fluid containing cup. In contrast, there is a much wider tolerance with thick layers of pre-wetting fluid and the immersion pre-wetting method. This is because pressure can be transmitted to the bubble by a purely hydrostatic mechanism, and alternatively, application of pneumatic pressure will not quickly re-saturate the pre-wetting fluid around a bubble in a via with gas because of the relatively long diffusion distances involved.

When pressure is applied, with the gas partial pressure in the bubble exceeding that in the pre-wetting fluid, the bubble will begin to dissolve. Eventually the bubble will completely dissolve, the total time for which depends on parameters such as its initial size, the applied pressure, and the original depth of the bubble inside the feature. After the bubble has completely dissolved, some time should generally be allowed to pass before the pressure is released, so that any excess dissolved gas (beyond that which will be soluble at 1 atmosphere) can equilibrate into the pre-wetting fluid as a whole. This avoids the possibility of re-nucleating a bubble inside the feature. When this is procedure is followed, the bubble will be removed from the feature and not reform upon release of the excess external pressure.

Referring to FIG. 1, curves D and E (90 versus 12 rpm rotation in a plating bath respectively) are calculated for the rates of bubble dissolution as discussed above, but in this case a) with the amount of initial gas dissolved in the solution equal to that in equilibrium with 1 atmosphere air (same as condition A, i.e., no degassing of the contacting fluid) and b) with an external applied pressure of 3 atmospheres. For this case, the total pressure of dissolved gas in the bulk fluid is equal to air at 1 atmosphere, and at the interface of the bubble, in equilibrium with 3 atmospheres of pressure. Comparing cases A and F (no degassing and no pressurization) with cases B and C (degassing but no pressurization) and cases D and E (no degassing but with pressurization) in FIG. 1, the pressurization of the fluid appears to be a good method in terms of achieving the shortest time of dissolution. Using a previously degassed pre-wetting fluid (0.2 atmospheres) in combination with a 3 atmosphere external fluid pressurization (a case not shown in FIG. 1) will generally lead to a further 50% reduction in degassing time for large features (3−1=2 atmospheres driving force versus 3−0=3 atmospheres driving force), according to calculations.

Note, however, that there is a potentially significant added advantage of using degassed fluid in this operation beyond just the reduction in gas removal time (which could be achieved, for example, by simply increasing the pressure to, say 4 atmospheres of pressure in this case). After the release of the externally applied pressure to the chamber, gas from the bubble and some of the gas from the external source (if pneumatically driven) will have dissolved into the pre-wetting fluid. As indicated above, unless one waits for equilibration (which can be a relatively slow process, taking several minutes or more), there is a tendency to re-nucleate and re-form a bubble inside the via, since after releasing the pressure, the fluid (particularly inside the feature) still can contain gas at a concentration in excess to that soluble at ambient conditions/pressures (i.e., in excess of that which would be in equilibrium with a pressure one atmosphere). In contrast, if the fluid is degassed before application of the externally applied pressure, this equilibration time can be largely eliminated, since there is a substantial excess capacity to absorb the gas from the bubble and thereby avoid re-nucleation and precipitation of the bubble.

Finally, depending on the wafer's orientation and the surface tension between the bubble and the inner via surface, it is possible that the shrinking of the trapped bubble by external compressive pressures down to a size significantly less than the diameter of the via could allow that bubble to detach itself from the wall and subsequently rise out of the via mouth due to its own buoyancy. Once the bubble has exited the via, the pressure can be removed without the possibility of the bubble being trapped inside. The terminal rise velocity of a bubble less than about 0.5 mm rising in an infinite media (no wall effects) depends on its diameter a, the kinematic viscosity v, and the Reynolds number Re, and can shown to be approximately given by:

$$V = \frac{2}{9}\frac{ga^2}{v} \text{ for } Re < 1.0 \quad (4)$$

$$V = \frac{1}{9}\frac{ga^2}{v} \text{ for } 20 < Re < 100 \quad (5)$$

where g is the acceleration of gravity and v is the pre-wetting fluids kinematic viscosity (fluid viscosity divided by fluid density).

The difference in the behavior of these cases (i.e., (4) and (5)) is that for low Re, convection is negligible and no wake is developed behind the rising bubble, versus the irrotational case (i.e., when the Reynolds number is high), where wake drag is considered and results in twice the drag. The time it takes for a bubble to rise the depth of the via can be calculated as t (sec)=h/V, which, for example, for a 10 μm diameter bubble in a 100 μm deep via (0.01 cm) would be about just under one second. Typically a 100 μm deep via might have a 25 μm diameter opening, so the assumption of a bubble rising in an infinite media is not correct, as wall flow-slip effects will increase the time. It is recognized that one could further speed up the process if an external body force were applied to the system in excess to or instead of gravity. For example, a centripetal force could be applied by spinning the wafer with the wafer opening pointed towards the center of rotation, helping to drive the bubble inwards.

Equations 4 and 5 underestimate the actual bubble rise time when the bubble diameter is close to the size of the via. This underestimation becomes a factor when the assumption of the bubble rising in an infinite media becomes fundamentally incorrect (i.e., for bubble diameters greater than about ¼ the feature diameter size). The shear flow stresses between the movement of the rising bubble and the via wall begin to dominate under such circumstances. Still, the conditions that satisfy the assumptions can be achieved simply by applying more pressure to the system (shrinking the bubble further), or by simply accounting for the expected longer bubble rise/clearing time when the bubble diameter is close to the via diameter.

Figure 4:
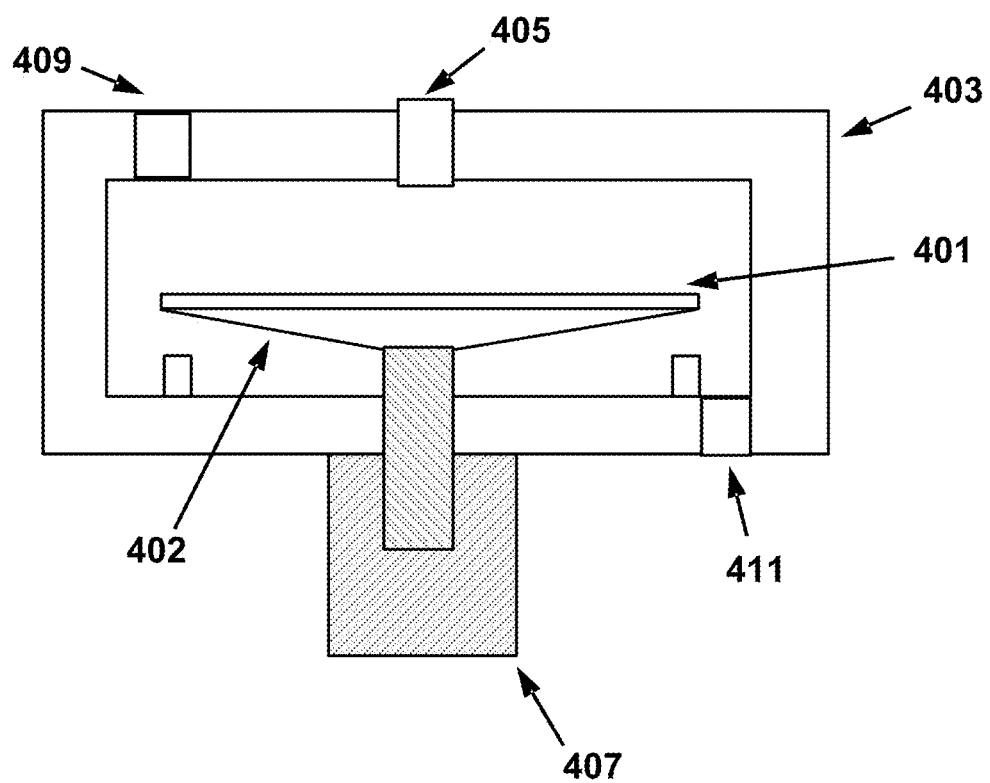
FIG. 4 depicts an embodiment of a pre-wetting chamber.

Different designs of pre-wetting chambers are described herein. One embodiment of a pre-wetting chamber is shown in FIG. 4. In this embodiment, the pre-wetting chamber is configured for delivering the pre-wetting fluid onto the wafer substrate in a liquid form. The pre-wetting chamber may also be configured for spraying or streaming the pre-wetting fluid onto the wafer substrate for a period of time. In FIG. 4, a wafer 401 is held face-up in pre-wetting chamber 403 with wafer holder 402. In some embodiments, the wafer holder is configured to hold the wafer substrate in substantially a horizontal orientation (i.e., parallel to the Earth's horizon), during the pre-wetting process. In other embodiments, the wafer holder is configured to hold the wafer substrate in substantially a vertical orientation during the pre-wetting process.

In a typical operation, vacuum is first pulled on chamber 403 though vacuum port 409, which is connected to a vacuum system (not shown). This reduces the pressure in the chamber to a subatmospheric pressure. After much of the gas in the chamber is removed by the vacuum, pre-wetting fluid is delivered onto the wafer surface from the nozzle 405 or other mechanism. In some embodiments, the pre-wetting fluid is degassed prior to contacting the wafer surface, again, to avoid gas being released as the pre-wetting fluid enters the vacuum environment. The wafer may be rotated with motor 407 during the pre-wetting fluid delivery process to insure complete wetting and exposure of the wafer. In some embodiments, the pre-wetting chamber is configured to deliver the pre-wetting fluid onto the wafer substrate. In some embodiment, the pre-wetting fluid is liquid. In some embodiment, the pre-wetting fluid (a liquid) first contacts the rotating wafer substrate within about 3 cm of the center of the wafer substrate. After pre-wetting, the wafer is spun at a low rpm with motor 407 to remove entrained pre-wetting fluid, but leaving a thin layer of fluid on the wafer surface. Excess pre-wetting fluid is drained and exits the vacuum chamber through port 411. The wafer is then transferred to a standard plating cell such as a Novellus clamshell cell for plating with a thin layer of pre-wetting fluid retained by surface tension on its surface and within its features.

Figure 5:
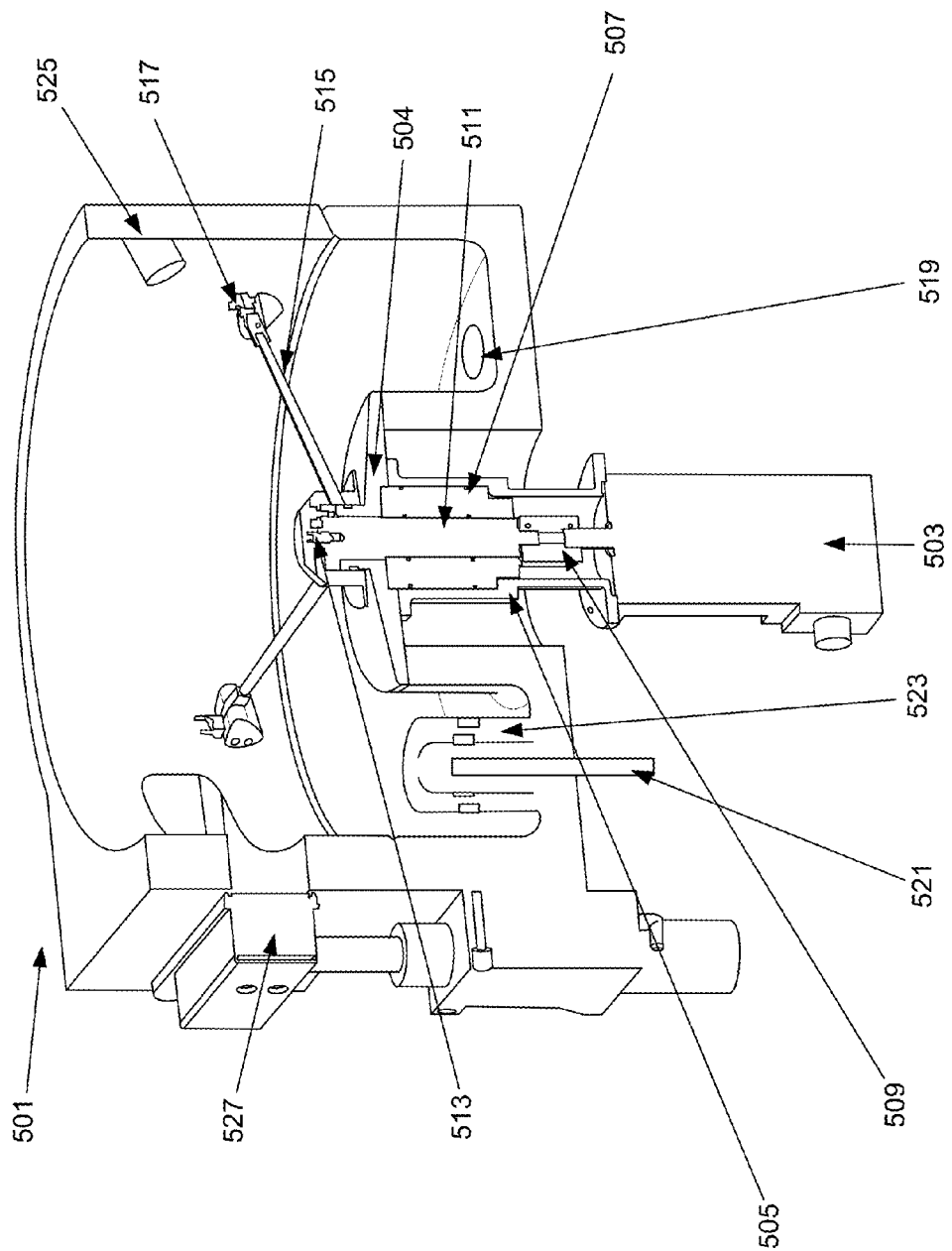
FIG. 5 depicts an isometric view of an embodiment of a pre-wetting chamber.

FIG. 5 depicts an isometric view of an embodiment of a pre-wetting chamber suitable for performing pre-wetting process described herein. FIG. 5 is a detailed schematic of a pre-wetting chamber similar to the embodiment shown in FIG. 4. Pre-wetting chamber 501 includes a motor 503 for rotating the wafer during processing is anchored below the chamber via the chuck to chamber base 504 by a motor-and-bearing supporting member 505, both of which also create a fluid seal between the bearing 507 and the underside of the chamber and the bearing. The bearing is a commercially available vacuum-pass-through central shaft rotary bearing. The motor is attached via a coupling 509 to a drive shaft 511 that passes though a vacuum isolating bearing to the chuck base 513. The chuck has three arms (515 is one arm) to support the wafer (wafer not shown), confinement pins, and other alignment apparatus 517 as appropriate.

At the lower section of the chamber is a drain 519 for removing excess pre-wetting fluid that may accumulate there after it is applied to the rotating wafer. The fluid is flung out toward the chamber walls and drops to the chamber base. In some embodiments, a wafer peripheral "fluid deflector shield" (not shown) is positioned approximately in the plane of the wafer to deflect fluid emanating from the wafer edge downward before hitting the chamber wall. The deflector shield may be moveable, or the wafer and wafer chuck plane may be adjusted by appropriate vertical moving mechanisms and seals. Also at the base of the chamber is a vacuum inlet and vacuum release line 521, housed in a fluid protecting shield 523 is some embodiments. This shield helps prevent surges of gasses from unnecessarily disturbing fluids within the chamber as well as minimizing the amount of liquid drawn into the vacuum line by isolating the two. While the vacuum line (and shield) can be located in the upper section of the chamber, it is advantageous to draw vacuum from below the wafer so as to minimize the propensity of any particles falling onto the wafer and forming defects. This can occur if particles or other materials enter the chamber during back filling the chamber with a gas or from the ambient environment while the chamber door is open. To minimize particles and other materials from entering the chamber, the chamber is typically backfilled with a particle-filtered inert gas such as nitrogen, carbon dioxide, or argon, and a slight positive pressure of clean particle free gas is feed to the chamber while the door is open. The backfill gas is typically filtered and the entering fluid enters a flow diffuser mounted on the wall of the chamber, so as to avoid a gas flow jet that might dry the wafer or disturb any chamber contents unnecessarily.

In some embodiments, a pre-wetting fluid nozzle 525 is located above and to the side but not over the centrally located wafer and wafer chuck, oriented and configured to spray or stream fluid to reach the wafer central regions. In other embodiments, the pre-wetting fluid nozzle is attached to a movable arm which can be positioned over the wafer. In the embodiment shown in FIG. 5, the chamber vacuum door 527 is located along the walls of the chamber, and configured to seal to the chamber itself. It can be moved away from the chamber as well as downwards (or upwards) so a wafer can enter the chamber freely, and then be repositioned to the sealing position after a wafer is placed onto the wafer holding chuck. The doors and other elements that potentially could hold entrained fluid should be designed such that the fluid may not drip onto the wafer. For example, the door's retracted position and associated hardware may be positioned below the plane that the wafer creates on insertion into the chamber, so as to avoid dripping fluid of otherwise contaminating the wafer during transit in or out of the chamber.

In some embodiments, the upper section of the chamber, particularly the areas above the plane where the wafer sits in the chuck and is extracted through the door, are heated above the temperature of the wafer that is to be pre-wetted. This includes both the areas that reside above the wafer (top surface or vacuum dome, not shown in FIG. 5) as well as the peripheral areas around the wafer. This heating is useful in avoiding liquid from dropping from the ceiling of the chamber onto the wafer before vacuum conditions are established, potentially trapping an air bubble inside a via where the drop fell, circumventing the desired process of putting a pre-wetting fluid onto the wafer only when air is first removed from the vias. Similarly, during the placement of a wafer into the chamber, liquid falling from the walls onto the wafer surface would have a similar effect. By heating the chamber walls, condensation on the walls and ceiling is avoided, as well as enabling the rapid evaporation of any stray droplets that might otherwise reach those positions, thereby keeping these areas dry.

While not shown in FIG. 5, in some embodiments a vertically moveable and automatable splash shield is positioned peripheral to the wafer and chuck and inside the chamber. The splash shield can be moved upwards during the application of fluid or at other times as suited to minimize and avoid, among other things, liquid from contacting the chamber door or upper walls. Alternatively, the wafer chuck can be moved downwards deeper into the chamber and below the plane of the vacuum door after wafer insertion, accomplishing the same purpose.

In other embodiments, rather than delivering a pre-wetting fluid to the wafer surface, the wafer is immersed in or otherwise covered with a pre-wetting fluid (e.g., by condensation) while vacuum conditions are maintained above the fluid and wafer. Since the creation of a vacuum within the chamber creates conditions where there is substantially no non-condensable gas in the chamber, the pre-wetting fluid is not impeded from entering a via. Put another way, the liquid does not need to displace any gas located within a via during pre-wetting, since the gas has been removed in a separate operation (pulling vacuum) prior to the pre-wetting operation.

Figure 6:
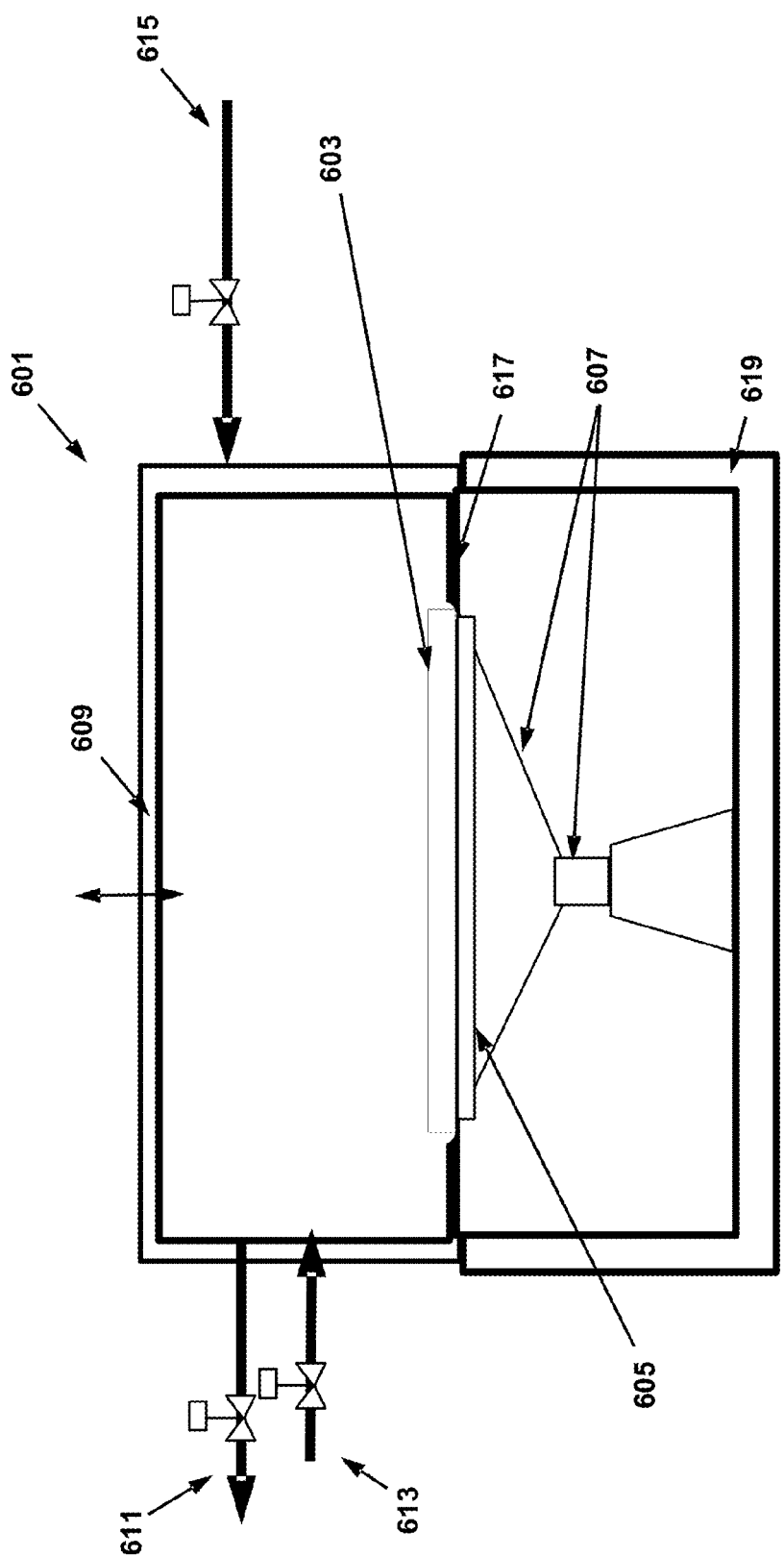
FIG. 6 depicts an embodiment of a pre-wetting chamber configured for a condensation pre-wetting process.

For example, in one embodiment, after vacuum is applied to the pre-wetting chamber, a condensable fluid vapor is created within the chamber or introduced to the chamber (e.g., vapors of water (e.g., low pressure steam), methyl alcohol, dimethylcarbonate, diethylcarbonate, isopropyl alcohol, dimethyl sulfoxide, and dimethyl formamide, or other liquid used as the subsequent plating electrolyte, easily dissolvable in a subsequent rinse, or soluble in the subsequent plating electrolyte). In embodiments where the wafer substrate has at least one recessed feature and the pre-wetting chamber is configured to deliver pre-wetting fluid onto the wafer substrate in a gaseous from, the pre-wetting fluid condenses to form a liquid film on the wafer surface that fills the recessed feature with the pre-wetting fluid. FIG. 6 depicts an embodiment of a pre-wetting chamber that is configured for such a condensation pre-wetting process. FIG. 6 shows chamber 601 that has a moveable vacuum lid (alternatively an access door) 609 allowing access to the chamber, a line to a vacuum source 611, a vacuum release line 613, and a condensable fluid inlet 615. Vacuum seal 617 seals the lower vacuum containment vessel 619 from the rest of the chamber. The wafer 603 sits on a wafer cooling element (chiller) 605 that is part of the wafer holding fixture (chuck) 607. The wafer cooling element 605 reduces the wafer substrate surface temperature to a temperature below the condensation temperature of the pre-wetting fluid that flows into the chamber thorough inlet 615 as a vapor. In another embodiment, after creating a vacuum and removing the condensable gasses (e.g., air) from the chamber 601 with vacuum, water is simply heated and allowed to vaporize (i.e., boil) in the chamber, and allowed to condense on the surfaces, including and preferentially on the cooler wafer 603, inside the chamber. For example, in a chamber without vacuum seals 617, a small amount of water in the lower section 619 of the chamber could be heated and allowed to flash simultaneously while vacuum is pulled inside the chamber. The connection to the vacuum can be removed (closed) at some point during the process.

Figure 7:
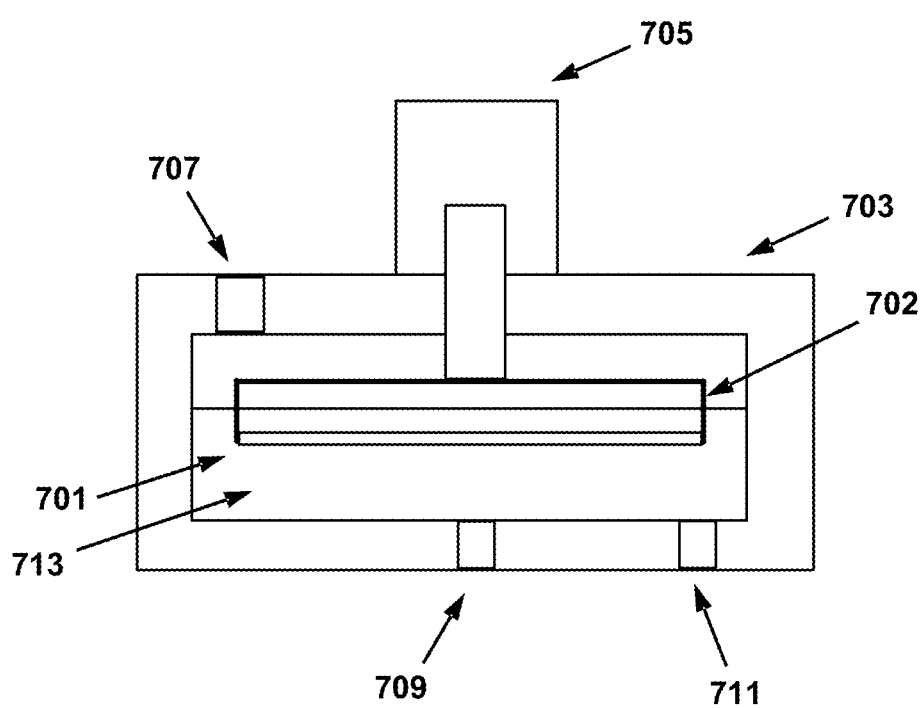
FIG. 7 depicts an embodiment of a pre-wetting chamber configured for an immersion pre-wetting process.

In another embodiment, the wafer substrate is immersed into a bath of pre-wetting fluid for a period of time. FIG. 7 depicts an embodiment of a pre-wetting chamber configured for such an immersion pre-wetting process. In FIG. 7, the wafer 701 is held in wafer holder 702 in a chamber 703. Chamber 703 has an inlet 711 for admitting pre-wetting fluid. As shown, the wafer is held in the wafer holder face up, and held by an appropriate mechanism that still allows fluid to reach wafer from the peripheral edge. Vacuum is pulled on chamber 703 though vacuum port 707, which is connected to a vacuum system (not shown). Then, the wafer is wetted with a pre-wetting fluid by, for example, either 1) the wafer and wafer holder moving down into the pre-wetting fluid 713 or 2) the pre-wetting fluid level rising by fluid entering through inlet 711. During the pre-wetting process, the wafer may be slowly rotated with motor 705. After the pre-wetting process, the liquid level is lowered, or the wafer raised, and the wafer is spun at low rpm with motor 705 to remove excess entrained fluid, leaving a thin pre-wetting fluid layer. A flow of nitrogen gas through port 709 may also be used to dry the backside of the wafer while the frontside of the wafer remains wetted. The wafer is then transferred to a standard clamshell for plating.

In other embodiments of the pre-wetting chamber shown in FIG. 7, the wafer can be held in a face down position. In some embodiments of a pre-wetting apparatus with a pre-wetting chamber as shown the FIG. 7, the pre-wetting apparatus is configured to initiate immersion of the wafer into the pre-wetting fluid after the pressure in the chamber has been reduced to less than about 50 Torr. The pre-wetting chamber 703 shown in FIG. 7 can be used in embodiments in which an external pressure is applied to dissolve bubbles, as described herein. The chamber and other components would need to withstand internal pressures instead of or in addition to vacuum.

Figure 8:
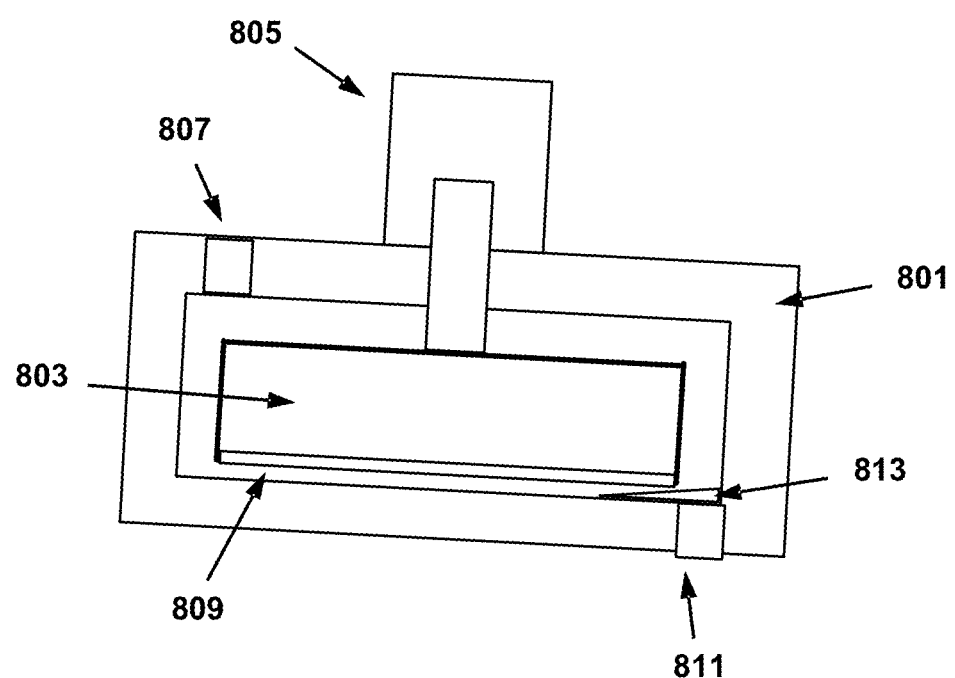
FIG. 8 depicts another embodiment of a pre-wetting chamber configured for an immersion pre-wetting process.

FIG. 8 depicts another embodiment of a pre-wetting chamber configured for an immersion pre-wetting process. FIG. 8 shows pre-wetting chamber 801, wafer 809, and fluid 813 or wafer holder 803 moving relative to each other. In this embodiment, the chamber and wafer holder 803 can be tilted for precise control of the pre-wetting front and complete liquid removal from the chamber. Also, the gap between the wafer 809 and the bottom of the chamber is small. As in FIG. 7, pre-wetting fluid in FIG. 8 may enter/exit though port 811 and a vacuum may be pulled on chamber 801 though vacuum port 807, which is connected to a vacuum system (not shown). Excess entrained fluid may be removed from the wafer surface by spinning it at a low rpm with motor 805. The embodiment shown in FIG. 8 is particularly useful when pre-wetting the wafer substrate surface with a high-cost pre-wetting fluid, or when it is otherwise desirable to use a minimal amount of pre-wetting fluid (e.g., so the level of dissolved gas can be maintained at low levels). After pre-wetting, the wafer is transferred to a standard clamshell for plating. A similar design of a narrow-gap, tilted surface pre-wetting apparatus, but without a mechanism for applying a vacuum during the pre-wetting operations, is described in U.S. patent application Ser. No. 11/200,338, filed Aug. 9, 2005, now U.S. Pat. No. 7,690,324, which is herein incorporated by reference.

The chamber shown in FIG. 8 can also be used in the embodiment in which an external pressure is applied, as described above. In this embodiment, the chamber and other equipment is designed or modified to be able to withstand and maintain internal positive pressures.

Figure 9:
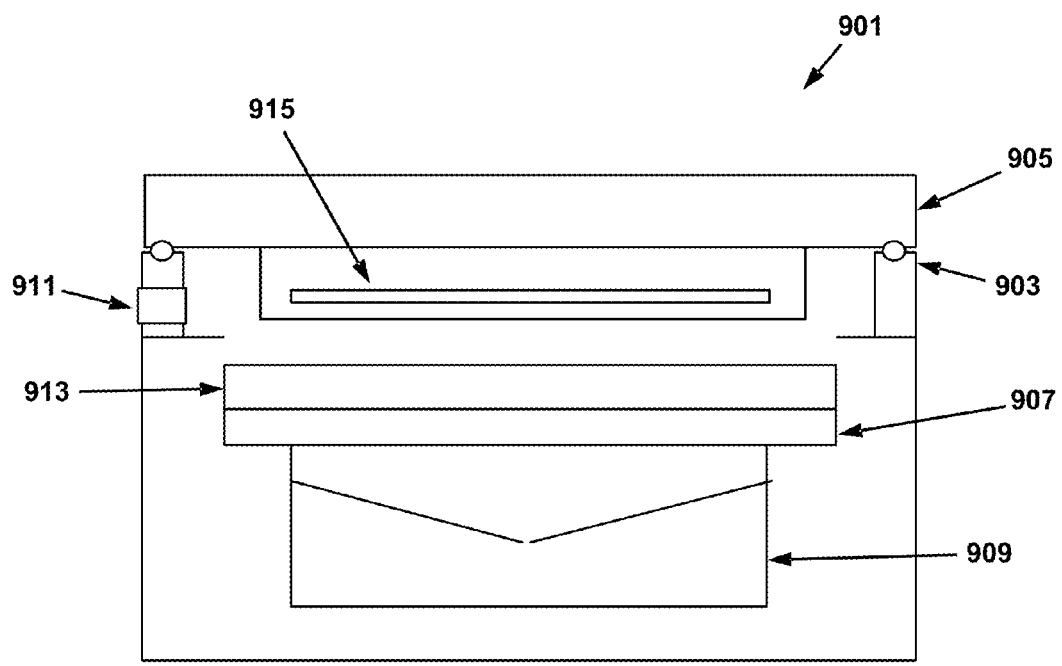
FIG. 9 depicts an embodiment of an apparatus in which the pre-wetting process is performed in a plating cell.

An embodiment of an apparatus in which the pre-wetting process is performed in a plating cell is shown in FIG. 9. Alternatively, this can also be stated that the pre-wetting chamber is configured to both pre-wet a wafer substrate and to electroplate a layer of metal on the pre-wetted wafer substrate. In FIG. 9, chamber 901 is a plating cell, with a vacuum sealing surface being a section of the cell wall 903. Wafer holding fixture 905 holds wafer 915. In the embodiment depicted in this figure, the plating cell contains an ionically resistive ionically permeable high resistance virtual anode (HRVA) 907 and a separated anode chamber (SAC) region 909. One example of an HRVA containing apparatus is described in U.S. patent application Ser. No. 12/291,356, filed Nov. 7, 2008, now U.S. Pat. No. 8,308, 931, which is incorporated herein by reference in relevant part. See also U.S. patent application Ser. No. 11/506,054, filed Aug. 16, 2006, now U.S. Pat. No. 7,854,828, which is incorporated herein by reference in relevant part.

Initially wafer 915 is held above the plating solution 913 and the vacuum is drawn on the chamber through vacuum port 911. When vacuum is drawn on the chamber, vacuum typically should be drawn on the backside of the wafer through the wafer holding fixture so that the wafer does not fracture. Afterwards, the fluid level 913 is raised, wetting the wafer surface. In some embodiments, this fluid is pre-wetting fluid, and in other embodiments, this fluid is a plating solution. In some embodiments, the fluid is degassed prior to contacting the wafer surface. Since there is no gas in the chamber, the fact that the wafer is face down does not lead to any trapped gas-containing bubbles below the surface or inside the vias. After the pre-wetting is complete, the vacuum can be released. Electroplating a metal (in some embodiments, copper) on wafer 915 can then begin. It is generally simpler (mechanically and processing conditions) to perform plating at ambient pressures, with or without wafer rotation. Alternatively, the vacuum can be held throughout the electroplating process. Again, it is advantageous in this and other embodiments to have the fluid degassed prior to performing the pre-wetting operations. Otherwise the fluid may release dissolved gas, forming bubble inside the features or on the surface as gas is driven out of the liquid by the lower pressure.

A general description of a clamshell-type plating apparatus having aspects suitable for use with embodiments described herein is described in detail in U.S. Pat. Nos. 6,156,167 and 6,800,187, which are incorporated herein by reference for all purposes.

Figure 10:
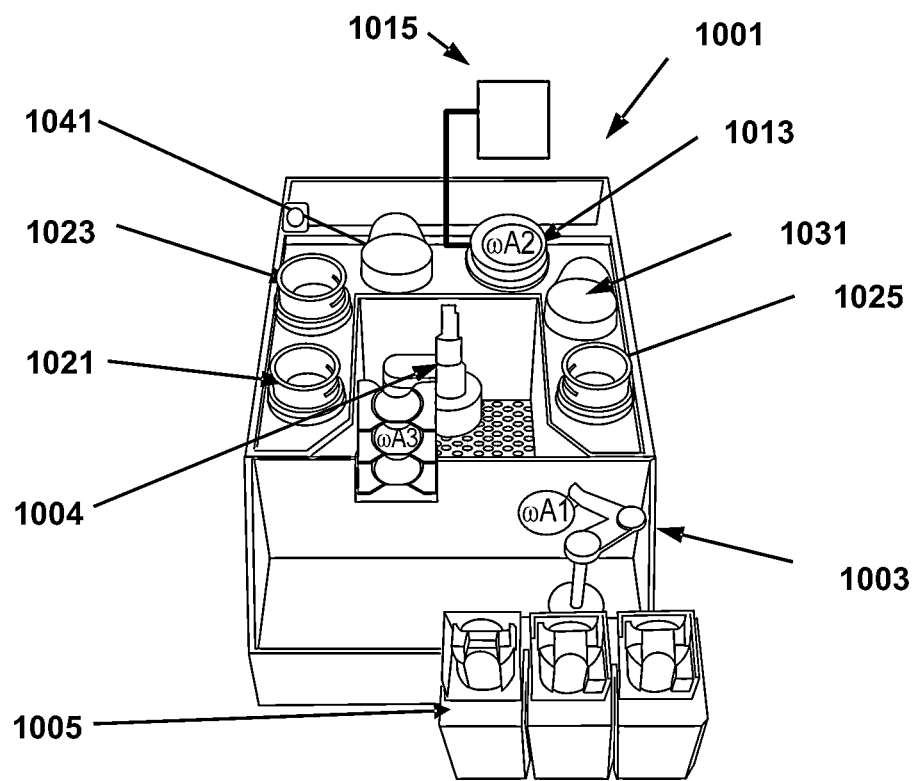
FIG. 10 depicts an embodiment of an electroplating system.

FIG. 10 depicts an embodiment of an electroplating system/module 1001 for processing wafers. The particular tool layout shown contains two separate wafer handling robots, 1003 which moves a "dry" wafer from a cassette stationed in a front FOUP (front opening unified pods) loader 1005 to an aligner module/transfer station (not shown) and a transfer chamber robot 1004. The aligner module ensures that the wafer is properly aligned on a transfer chamber robot 1004 arm for precise delivery to other chambers/modules of the system. In some embodiments, the aligner module both aligns the wafer azimuthally (so called "wafer notch aligning") as well as in the vertical and horizontal planes to a particular location (i.e., fixes the wafer's x, y, and z position registry).

The same or a different transfer chamber robot is used to feed the wafer back from the back end "wet processing area" of the tool to the FOUP after processing and drying is completed. A back end robot (not shown) may contain two or more arms, each with a single or multiple "end-effectors" to grip the wafer. Some "end-effectors" grip the wafer at the bottom of the wafer with a vacuum "wand", and others may hold the wafer only at is peripheral edge. In some embodiments, one robot wafer handling arm end-effectors is used only for handling a wafer that has a wet surface, and the others reserved for handling only fully dry wafers, thereby minimizing contamination.

After a wafer enters the transfer station (containing transfer chamber robot 1004), the wafer typically is fed to a pre-wetting chamber 1013 (i.e., a pre-wetting apparatus is a station in a module, the module further including an electroplating station configured to electroplate the wafer with a metal, the metal being copper in some embodiments), the various embodiments of which are described herein. In other embodiments, system 1001 is configured for an anodic process. In such embodiment, the module further includes a station configured for an anodic process, such as electro-etching or electropolishing.

The pre-wetting chamber 1013 is either configured to pre-wet a wafer under vacuum or to apply pressure to a wetted wafer, and in some embodiments, both. Using a pre-wetting chamber configured to pre-wet a wafer under vacuum as an example, ambient air is removed from the chamber while the wafer is spun. Once vacuum is achieved, the device side of the wafer is exposed to degassed pre-wetting fluid (degassed in module 1015 with a degassing flow loop). After wetting is complete, excess fluid is removed, gas is reintroduced to the chamber to atmospheric pressure, and the chamber is opened to allow the wafer to be extracted by the robot or other transfer mechanism. In some embodiments, the transfer mechanism is configured to transfer the pre-wetted wafer substrate from the pre-wetting station to an electroplating station in less than about one minute.

In some embodiments, the wafer is then placed into an aligner (not shown), such as a notch aligner. By passing though a high-accuracy notch aligner, accurate placement into a edge sealing plating cell, which excludes plating solution from the back and the very small device side edge exclusion region (e.g., about 1 mm from the edge), is possible. The plating cell may be specially designed to have a seal that traverses the notch area. Plating and feature filling (i.e., a layer of metal is electroplated on the wafer substrate) occurs in plating cell 1021, 1023, or 1025, (i.e., electroplating stations) and in some embodiments, the plating solution is a degassed solution. In some embodiments, the metal is copper. The electroplating stations are configured to immerse the wafer in a degassed plating electrolyte in the electroplating station. In some embodiments, an electroplating station is configured to cathodically polarize the wafer substrate before immersing the wafer substrate in a degassed plating electrolyte. The plating solution can be recycled though a separate degassing loop different from a flow loop between a main plating bath and the plating sell, or by passing though the degassing element in the same loop as the bath/plating cell loop, being degassed just prior to entering the plating cell.

After plating is completed the wafer is rinsed with water above the plating cell and spun to remove excess entrained fluid, the wafer holding clamshell apparatus is opened releasing the edge seal and allowing wafer extraction. In some embodiments, the wafer is then picked-up from the plating cell and transported in to a metal removing isotropic etching module (ITE module) 1031. The ITE module is a wet etching module used to remove metal from the top of the wafer primarily in the field region over the feature of the plated wafer, while leaving at least some metal inside the recessed features. Various designs of suitable equipment, etching processes, and etching chemical formulations are described in U.S. Pat. Nos. 5,486,235, 7,189,649, 7,338,908, 7,315,463 and U.S. patent application Ser. No. 11/602,128, filed Nov. 20, 2006, now U.S. Pat. No. 8,158,532, Ser. No. 11/888,312, filed Jul. 30, 2007, now U.S. Pat. No. 7,972,970, and Ser. No. 11/890,790, filed Aug. 6, 2007, now U.S. Pat. No. 8,470,191, each incorporated herein by reference.

In addition, metal at the edge of the wafer is removed in the ITE module 1031. Because a wafer is often held in an edge excluding clamshell apparatus, only a thin layer of seed metal exists at the outermost periphery (the original seed layer) prior to the top side global etching performed here. Therefore, after processing here, it is common for the extreme edge of the wafer to be completely bare of metal, while the more central, non-plating protected and edge excluded region may have some metal remaining (however, in other cases, the metal is removed from that region as well). This module can therefore perform both the global etch removal of metal from the wafer as a whole, as well as remove metal from the outer periphery edge and outer peripheral bottom of the wafer, often eliminating the need to perform a more complex edge specific etch process, edge bevel removal (EBR), as described in, for example, U.S. Pat. No. 6,309,981, incorporated herein by reference.

In some embodiments, the progress of the etching process and the thickness distribution of the film is monitored in the etching module, for example, by measuring the cross wafer sheet resistance with an eddy current meter, or the reflection of an acoustic signal. Alternatively, the thickness after etching can be measured in the transfer station in the dry state later in the process, and the process results monitored or modified as appropriate to minimize any wafer-to-wafer performance drift. After etching, the wafer can be either rinsed and dried in the etching module, or moved to a separate module, a wafer rinsing, cleaning and drying station 1041. There, any oxide film that may have formed in the process sequence is removed or reduced (e.g., by applying a dilute acid solution to the surface), any residual chemical not removed by a more cursory rinse in the etching station is removed (both front and back of the wafer), and an edge bevel removal operation is performed as desired (see, for example, U.S. Pat. No. 6,309,981). After rinsing the wafer with water, it is spun dry and then removed to a transfer station, where the front end robot re-deposits it into the wafer holder cassette.

One concern with the pre-wetting process is that in the time between pre-wetting and plating (i.e., after exposing the wafer to pre-wetting fluid while under vacuum in a pre-wetting chamber but before plating commences), it is possible to have the wafer surface "de-wet". Dewetting may be described as a physical draining and coagulation of the pre-wetting fluid from the surface (i.e., rather than a drying of the surface), leaving one section of the surface with a thicker film of pre-wetting fluid, and another section with no pre-wetting fluid thereupon. This characteristic behavior is generally associated with a highly hydrophobic surface with respect to the pre-wetting fluid. If the wetting layer pulls back or coagulates from a previously wetted surface, then the attributes of the pre-wetting process are lost. To avoid this phenomenon, wetting agents can be added to the pre-wetting fluid to avoid the pooling of the fluid into puddles.

Surface oxides, surface contaminants, and other deposited materials on the wafer surface that are exposed to air and humidity may be very hydrophobic. For example, thin copper metal seed layered wafers exposed to air and water vapor will form a thin cuprous oxide layer, which is hydrophobic with respect to water. To avoid this potential problem, the oxide film can be removed in certain embodiments by, for example, by adding a small amount of acid (e.g., $H_2SO_4$, $H_3PO_4$) at a pH where the oxide is no longer stable, to the pre-wetting fluid used in the pre-wetting process. The acid will react with the oxide to form water and the metal salt. The pre-wetting fluid can also contain small amounts of surface tension and contact angle lowering wetting agents (e.g., surfactants, alcohols) which also avoid the phenomena. Pre-wetting fluid chemistry is discussed further herein.

In some embodiments where the pre-wetting operation is performed in a separate chamber prior to plating, the pre-wetting fluid may contain a small amount of metal ions, for example, to aid in avoiding the formation of bacteria in the system or modifying the oxide removal properties. Alternatively, a metal oxide suitable reducing agent may be added to the wetting solution, such as formaldehyde, glyoxylic acid or dimethyl-amine borane, or with a metal ion complexing additive (for copper, examples might include ammonia, glycine, ethylene diamine). Further, the surface oxide or other contaminants can be removed by treating the wafer in a reducing atmosphere (e.g., forming gas or hydrogen in argon), with or without heating, prior to the pre-wetting operation. The temperature of the pre-wetting fluid and the wafer surface can also be increased or decreased from ambient conditions to optimize the retention of fluid on the surface.

In some embodiments, operations in a pre-wetting chamber or a pre-wetting chamber that is part of an electroplating system are controlled by a computer system. The computer includes a controller including program instructions. The program instructions may include instructions to perform all of the operations needed to pre-wet a wafer substrate. In one embodiment, the instructions are for reducing pressure in the process chamber to a subatmospheric pressure and subsequently contacting the wafer substrate with the pre-wetting fluid at a subatmospheric pressure to form a wetting layer on the substrate surface. The wafer substrate may be rotated at a first rotation rate during delivery of a liquid pre-wetting fluid onto the wafer substrate at a subatmospheric pressure, the fluid delivery being performed for between about 10 to 120 seconds. Then, delivery of the pre-wetting fluid is stopped. After stopping the delivery of the pre-wetting fluid, the wafer substrate is rotated at a second rotation rate to remove excess surface entrained pre-wetting fluid from the wafer substrate. In some embodiments, the vacuum in the process chamber is released after the delivery of the pre-wetting fluid is stopped and prior to removal of the excess entrained pre-wetting fluid. In alternative embodiments, the vacuum is released after removal of the excess entrained pre-wetting fluid. The wafer may be rotated at different rates in different embodiments. In some embodiments, the first rotation rate during delivery of a liquid pre-wetting fluid onto the wafer substrate is less than about 300 rpm and the second rotation rate to remove excess entrained pre-wetting fluid from the wafer substrate is at least about 300 rpm. In other embodiments, the first rotation rate is about 100 rpm or less, and the second rotation rate is at least about 500 rpm. In yet further embodiments, the pre-wetting apparatus is configured for removing excess entrained pre-wetting fluid from the wafer substrate by a method selected from the group consisting of centrifugal spinning, air-knife drying, and wiping and the controller includes program instructions for performing these operations.

Process/Method

In a general pre-wetting method for some embodiments disclosed herein, a vacuum is first created in the environment around the wafer. Then, the wafer surface is sprayed with, streamed with, covered with, or immersed in sufficient (in some embodiments, degassed) pre-wetting fluid, eventually exposing the entire wafer to a sufficiently thick liquid layer. The layer may not cover the entire surface at all times, until later in the process. The wafer surface is then left immersed or otherwise exposed to a pre-wetting fluid layer for a period of time (e.g., by continuing to spray, stream, cover, or immerse the surface with additional fluid) until adsorption (or reaction) of any pre-wetting fluid constituents at the wafer surface have substantially reached completion/ equilibrium and a favorable/uniform wetting character (hydrophilicity, low contact angle) is achieved. After pre-wetting, the spraying, streaming, or covering of the wafer with pre-wetting fluid is stopped. In some embodiments, vacuum is released and then excess entrained fluid is removed from the (now) completely hydrophilic surface (e.g., by centrifugal spinning, air-knife drying, squeegee wiping, etc.), leaving a thin uniform adherent layer of pre-wetting fluid on the surface. In other embodiments, excess entrained fluid is removed before releasing vacuum. Finally, the wafer is transferred to plating cell to plate the wafer.

Because there may be anywhere from a few seconds to over a minute between the time that entrained pre-wetting fluid is removed from the wafer surface to the initiation of metal deposition, it is important that the wafer is globally hydrophilic and remain completely coated with fluid over the entire surface. In the ensuing time, a hydrophobic surface/fluid combination can lead to the fluid receding from, and uncovering a portion of, the wafer surface, for example, starting from the wafer edges. This de-wetting may cause the fluid to be drawn out from within any recessed features within the wafer substrate, possibly leading to gas being trapped within the feature on immersion into the plating bath. Hydrophobic surfaces, particularly those that have completely de-wetted in some regions, have non-uniform fluid pre-wetting layer thickness over the wafer substrate. In the case that the pre-wetting fluid in use has a different composition than the plating bath, the subsequent immersion of the pre-wetted wafer into the plating solution will not allow for a uniformly wetted surface if the pre-wetting fluid has not wetted the wafer properly. The non-uniformly wetted wafer will cause the diffusion times and concentrations various components to be different across the wafer's surface due to the thickness of the wetted layer. This can lead to variation in feature filling behavior or the creation of various wafer surface defects, such as lines of entrapped bubbles, metal pits, metal thickness variations, or growth protrusions. Therefore, after the pre-wetting process, the pre-wetting fluid should create a uniform, small contact angle with respect to the entire wafer surface, for example, a contact angle of about 45 degrees or less, if possible. When a lower contact angle is possible, a very thin and adherent pre-wetting fluid layer can be created.

It is often observed that the contact angles of a surface can change with time, and that hydrophobic surfaces may become more hydrophilic over time when exposed to certain liquids. Certain wafer surfaces, such as those coated with copper films by, for example, plasma vapor deposition, can exhibit a significant decrease in the liquid/surface contact angle with time upon continuously exposing the surface to the pre-wetting fluid. In particular, the continual exposure of such a surface, while under vacuum conditions, can lead to rapid and complete transformation of the surface from a generally de-wetted, hydrophobic state, to a wetted, hydrophilic state.

Furthermore, this transformation, specifically when occurring under vacuum and with a degassed pre-wetting fluid, leads to particularly favorable low defectivity when combined with the subsequent plating operation. While not wanting to be bound by any particular wetting model or theory, if sufficient time to pass is allowed to pass (e.g., 5 seconds to 1 minute) while the surface is immersed in, sprayed with, streamed with, covered with, or otherwise treated with a surface-tension-lowering pre-wetting fluid, the surface can undergo a conversion from a hydrophobic to a hydrophilic state. For example, by allowing time for low concentration constituents (e.g., wetting agents) time to adsorb to the wafer interface, or alternatively, time for spurious adsorbed species that reside on the surface (e.g., from atmospheric exposure) to be desorbed from the surface, suitable stable wetting behavior can be obtained. Alternatively, agents in the pre-wetting fluid may react to slightly roughen the surface and/or remove thin surface layers such as surface oxides, nitrides, or carbonates.

As a specific example, the transformation of a cuprous or cupric oxide laden surface, which tends to be inherently quite hydrophobic to water, to a hydrophilic metallic surface, is needed. By simple exposure to either de-ionized (DI) water (which does not react with the oxide), the surface may remain largely hydrophobic. Alternatively, by exposing the surface to a slightly acidic oxide removing solution, such as DI water containing a small amount of either dissolved acid (e.g., sulfuric, methane sulfonic, or acetic acid, resulting in a pH of between about 2 to 4), with or without dissolved metal ions and salts, a small amount of metal (e.g., copper) complexing agent (e.g., citrate, pH of between about 3 to 6, glycine or ethylene diamine, pH of between about 6 to 12) or to a solution containing an appropriate metal oxide reducing agent/compound (e.g., formaldehyde, glycolic acid, dimethylamine borane), is effective in removing the surface oxide and transforming a hydrophobic interface to a hydrophilic interface. Two examples of copper surface oxide removing reactions in a weak acid are:

$$CuO + 2H^+ \rightarrow Cu^{+2} + H_2O, \text{ and} \tag{6}$$

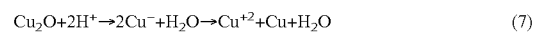

$$Cu_2O + 2H^+ \rightarrow 2Cu^- + H_2O \rightarrow Cu^{+2} + Cu + H_2O \tag{7}$$

A thin oxide surface layer of cuprous and cupric oxide on copper is formed almost immediately and continues to grow in thickness over time, simply as a result of exposure of the sputtered copper surface to atmospheric air, particularly moist air (i.e., air with humidity). The oxide can be converted/removed by exposure to an appropriate removal agent (such as those listed herein), but it is important to consider complete oxidation of the copper layer (also, e.g., within the feature). Subsequent removal of the metal oxide layer by use of an oxide removal process (as opposed to an oxide reducing process) may inhibit subsequent film growth for a fully oxidized copper layer. Also, the wetting conversion process (such as those listed herein) are chemical reactions having finite reaction rates. For example, exposing the wafer to the oxide removing pre-wetting fluid or plating bath will begin to form a layer of hydrophilic surface at the point of fluid contact. Areas with longer exposure to the pre-wetting (e.g., oxide removing) fluid may prevent other areas of the wafer from becoming wetted in the process. The hydrophilic areas that may be created can tend to channel fluid flow thereupon, preventing the wetting of other areas. One objective, therefore, is a modification of the contact angle, wetting properties, and general wetting process to enable the entire surface to become eventually uniformly covered with liquid, both macroscopically and microscopically.

By applying a degassed pre-wetting fluid to the surface while simultaneously maintaining a low pressure/vacuum atmosphere, the impediment of simultaneously expanding, flushing, or otherwise removing trapped gas from the surface is substantially eliminated, and so the impediment of exposing areas of the wafer that are still hydrophobic due to no or limited previous exposure to the pre-wetting fluid may be reduced. Considering the process without employing the vacuum and wetting combination, the various regions of the wafer surface will fall into 5 wetted categories: 1) Hydrophobic Wetted: Covered with and wetted with pre-wetting fluid but for an insufficient time, so it is still hydrophobic; 2) Hydrophilic Wetted: Covered with and wetted with pre-wetting fluid for a sufficient time, so it is has become hydrophilic; 3) Un-wetted: Hydrophobic, exposed to air, and never exposed to pre-wetting fluid; 4) De-wetted: Previously wetted, but having become de-wetted, and again exposed to air; 5) Trapped Bubble: Containing a bubble containing trapped air at the surface and under a layer of pre-wetting fluid.

It is important to note that an area in state 3, 4, or 5 will not undergo any adsorption or chemical reaction, leading to the absence of any hydrophobic-to-hydrophilic surface transformation unless and until that region later becomes wetted. Furthermore, areas around state 3 that are in state 1 or 2 are wetted and are or will become hydrophilic, allowing fluid to flow freely and continuously over this surface and making the removal of the bubble or wetting of adjacent surfaces considerably more difficult. Also, a currently hydrophobic surface region, having previously been exposed to pre-wetting fluid, may repeatedly go between the states of liquid-coverage-free and covered but hydrophobic. The process continues converting between these states as fluid wicks away to adjacent hydrophilic area, oscillating back and forth from state 1 to state 3 multiple times, until eventually it either it i) changes to state 2 and becomes hydrophilic and wetted, thereafter stays in state 2, or ii) become surrounded by areas that are more wetting, encapsulates a bubble, and transforms to state 4.

The above processes, performed under atmospheric conditions (i.e., in air), should be contrasted with processes performed under vacuum (and with degassed pre-wetting fluid). In these processes, there are only three wetted categories that exist: 1) Wetted: Covered and wetted with pre-wetting fluid; 2) Un-wetted: Exposed to vacuum and never exposed to pre-wetting fluid; 3) De-wetted: Previously wetted, but having become de-wetted and re-exposed to vacuum.

A pre-wetting process performed under vacuum ensures that, as long as a particular part of the wafer has been exposed to pre-wetting fluid (state 1) for sufficient time, the particular part of the wafer will eventually become hydrophilic. Unlike a pre-wetting process performed in atmosphere, a high fluid velocity pre-wetting fluid stream is not required to "flush away" trapped bubbles. Furthermore, bubble flushing is not 100% effective, and will often lead to bubble fragmentation, leaving a large number of smaller, hard to remove bubble behind. Hence, pre-wetting under vacuum is a much more reliable low defect process over simply spraying, covering, or immersing the wafer into a pre-wetting fluid under atmosphere. Other factors that favor pre-wetting under vacuum are that a) surface energies of the vacuum/liquid/metal interface are different and the contact angle is often lower than the air/liquid/metal interface, b) metal oxide/nitride/carbonate reformation is avoided, and c) using degassed fluid prevents the possibility of gas precipitating out of the fluid, for example, as a result of a spurious temperature or pressure change at some points at the liquid-wafer interface.

Figure 11A:
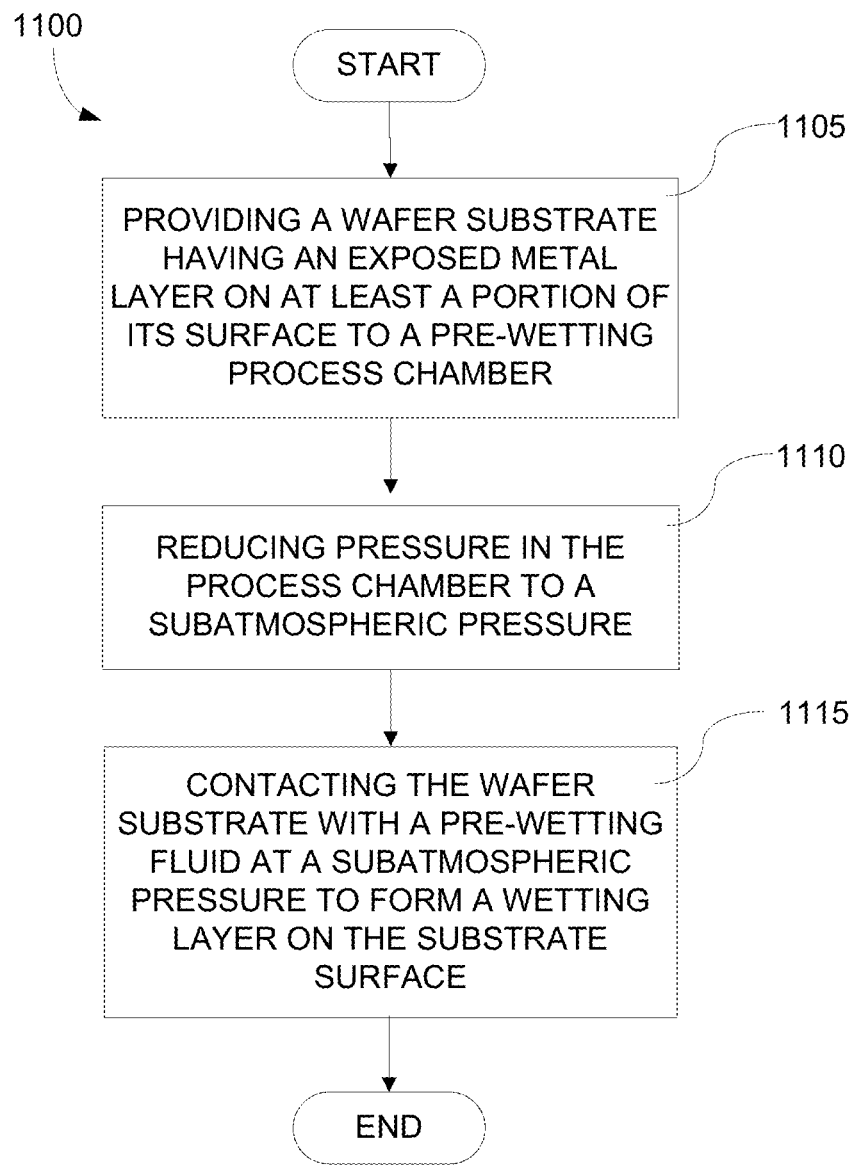
FIGS. 11a and 11b are flow diagrams for embodiments of a pre-wetting process.

FIG. 11a is a flow diagram for a general embodiment of a pre-wetting process (1100). A wafer substrate having an exposed metal layer on at least a portion of its surface is provided to a pre-wetting process chamber (1105). The pressure in the process chamber is then reduced to a subatmospheric pressure (1110). The wafer substrate is then contacted with a pre-wetting fluid at a subatmospheric pressure to form a wetting layer on the wafer substrate surface (1115). Such a pre-wetting process can be performed in the pre-wetting apparatus designs described herein.

The wafer substrate has different features in different embodiments. The wafer substrate may have at least one recessed feature. The recessed feature may be a damascene feature, which are formed by damascene patterning processes. A damascene plating process is a process in which a recess in a dielectric layer of a semiconductor wafer formed by a damascene patterning process is filled with a metal film. A recessed feature may also be a though-mask feature.

In some embodiments, the pre-wetting fluid is substantially free of dissolved gases. In some embodiments, one or more dissolved gases are removed from the pre-wetting fluid prior to contacting the wafer with the pre-wetting fluid. To aid in removal of dissolved gases, in some embodiments, the pre-wetting fluid is cooled to less than about 20° C. during removal of the gases. To remove gases from a pre-wetting fluid to obtain, in some instances, a pre-wetting fluid that is substantially free of dissolved gases, a pre-wetting fluid treatment tank has the pre-wetting fluid circulating for a specific time period (typically ½ an hour, depending on the capabilities and capacity of the degasser) though a degassing loop before contacting the wafer substrate with pre-wetting fluid. This is discussed herein with respect to FIG. 3. Typically this implies that fluid is flowing through the loop while the vacuum pump is on and at vacuum, and the valve connecting the degasser and to the pre-wetting tank to the pump is open. This ensures that the pre-wetting fluid that is subsequently applied to the wafer surface is substantially free of dissolved gases. Measurements of a system so designed shows residual levels of dissolved oxygen reaching as little as about 1-2% or less of that saturated with oxygen from air.

Furthermore, dome and wall heaters on the process chamber may be turned on, set to a temperature of about 10° C., and in some instances about 20° C. or greater, than that of the pre-wetting fluid temperature. For example, if the fluid temperature is about 20° C., a wall temperature of about 40 to 50° C. is appropriate. Dome and wall heaters avoid condensation on the surfaces and the potential for liquid droplets falling onto the exposed surface prior to pre-wetting under vacuum. A purge of the chamber surfaces can be accomplished by bringing the chamber to vacuum with the door closed and the walls at the target heated temperature. For example, without a wafer present in the chamber and the walls heated, the chamber is brought to vacuum and remains at vacuum for about 10 minutes or more, so as to remove any liquid which might have accumulated on the chamber ceiling and upper walls. The vacuum can be removed by backfilling with, for example, clean dry nitrogen. This procedure removes any possible condensate from the chamber walls and minimizes the formation of gas born particles. After confirming that a) all chamber fluid level sensors are at appropriate values (e.g., tank full, chamber empty), b) the heater is on, and c) the vacuum is ready for processing, the pre-wetting chamber process door can be opened and the door shield (if so equipped) dropped. Next, a wafer is placed into the chuck and the robot arm is retracted, the vacuum door is closed, and the liquid splash shield is raised or the wafer lowered below the shield (if so equipped).

A target level of vacuum for the pre-wetting process in some embodiments is between about 10 and 100 torr, for example about 40 torr. In some embodiments, the vacuum (i.e., subatmospheric pressure) is about 50 torr. In some embodiments, after pump down is complete, the vacuum line can be closed, while in other embodiments, the pump continues to pull a vacuum while pre-wetting fluid is injected into the chamber and onto the wafer.

In some embodiments, a liquid pre-wetting fluid is delivered onto the wafer substrate surface. This may entail immersing the wafer substrate in the pre-wetting fluid. Alternatively, this may entail spraying or covering the wafer substrate with the pre-wetting fluid. In other embodiments, contacting the wafer substrate with a pre-wetting fluid is performed by delivering a gaseous pre-wetting fluid onto the wafer substrate. The gaseous fluid is allowed to condense and form the wetting layer on the wafer substrate. In these embodiments, the temperature of the wafer substrate may be reduced below the condensation temperature of the pre-wetting fluid before exposing the wafer substrate to the pre-wetting fluid.

In some embodiments, the wafer may be rotated while a liquid pre-wetting fluid is delivered onto the wafer substrate surface. In some embodiments, the wafer substrate is rotated at a rate of between about 10 rpm to 300 rpm. In further embodiments, the wafer substrate is rotated at a rate of between about 10 rpm to 100 rpm. In other embodiments, the wafer substrate is spun at speed of from about 100 to 400 rpm, for example at about 300 rpm. In some cases a higher rotation rate (e.g., about 400 to 800 rpm), or a cycling of rotation rate, may be used for a short time (about 2 to 10 seconds) where overcoming fluid wetting resistance of a highly hydrophobic wafers is an issue. Chamber pump down may be initiated before of after wafer rotation is started.

In embodiments where a liquid pre-wetting fluid in used, flow of the pre-wetting fluid is initiated into the chamber and onto wafer surface. A typical flow rate of between about 0.5 and 2 lpm, for example, about 0.8 lpm, is used, for between about 3 seconds and 1 minute or more, for example, for about 20 seconds, depending on the necessary time to achieve full wetting of a particular surface, rotation rate of the wafer, and the wetting properties of the fluid. In some embodiments, the pre-wetting fluid is contacted with the wafer substrate from about 10 second to 120 seconds. After the wetting process is complete, the pre-wetting fluid flow is stopped, for example, by closing a pre-wetting fluid flow valve.

Next, the chamber is brought to an atmospheric pressure. In some embodiments, the chamber is brought to an atmospheric pressure with an oxygen-free gas, e.g., dry nitrogen.

In some embodiments, excess pre-wetting fluid is removed from the substrate surface. This can be done before or after bringing the chamber to an atmospheric pressure. In some embodiments, excess pre-wetting fluid is removed from the wafer substrate surface by rotating the wafer substrate. The wafer substrate rotation rate is increased to a value where excess entrained fluid can be removed from the wafer substrate surface, but a thin layer of liquid remains. The wafer substrate may be rotated from about 300 rpm to 1000 rpm during removal of the excess pre-wetting fluid. The wafer substrate may be rotated less than about 20 seconds during removal of the excess pre-wetting fluid. In other embodiment, the wafer substrate rotation rate is increased to between about 250 and 800 rpm for between about 5 and 60 seconds, while avoiding the complete drying of the pre-wetting fluid. While the rotation process generally can be initiated prior to the release of vacuum, by performing this step after the release of vacuum, it is believed that the potential for the wafer drying is reduced, because the evaporative drying from a thin layer and the possibility of creating a dry surface at some point on the wafer may be less.

After removing the excess entrained fluid from the wafer substrate surface, the wafer substrate rotation is stopped, the splash shield lowered and/or the wafer substrate raised (if so equipped), the vacuum door opened, and the wafer removed from the chamber and placed in an electroplating chamber. In some embodiments, the pre-wetted wafer substrate is exposed to an environment outside of the chamber and the electroplating chamber for less than about one minute. In other embodiments, the pre-wetted wafer substrate has a wetting layer having a thickness of between about 50 to 500 µm immediately prior to electroplating when it is transferred to the electroplating chamber. After the wafer substrate is in the electroplating chamber, the wafer substrate is electroplated using a degassed plating solution, in some embodiments. In some embodiments, the pre-wetted wafer substrate is cathodically polarized with respect to a plating solution before contacting the wafer substrate with the plating solution. The pre-wetting process chamber and the electroplating chamber may be distinct stations of one apparatus module. In other embodiments, the wafer substrate is electroplated in the same chamber than was used for pre-wetting. In these embodiments, the electroplating may be performed using a degassed plating solution.

In alternative embodiments, after removing the pre-wetted wafer substrate from the pre-wetting process chamber, the pre-wetted wafer substrate is transferred to a chamber configured to perform an anodic process such as electroetching and electropolishing.

Figure 11B:
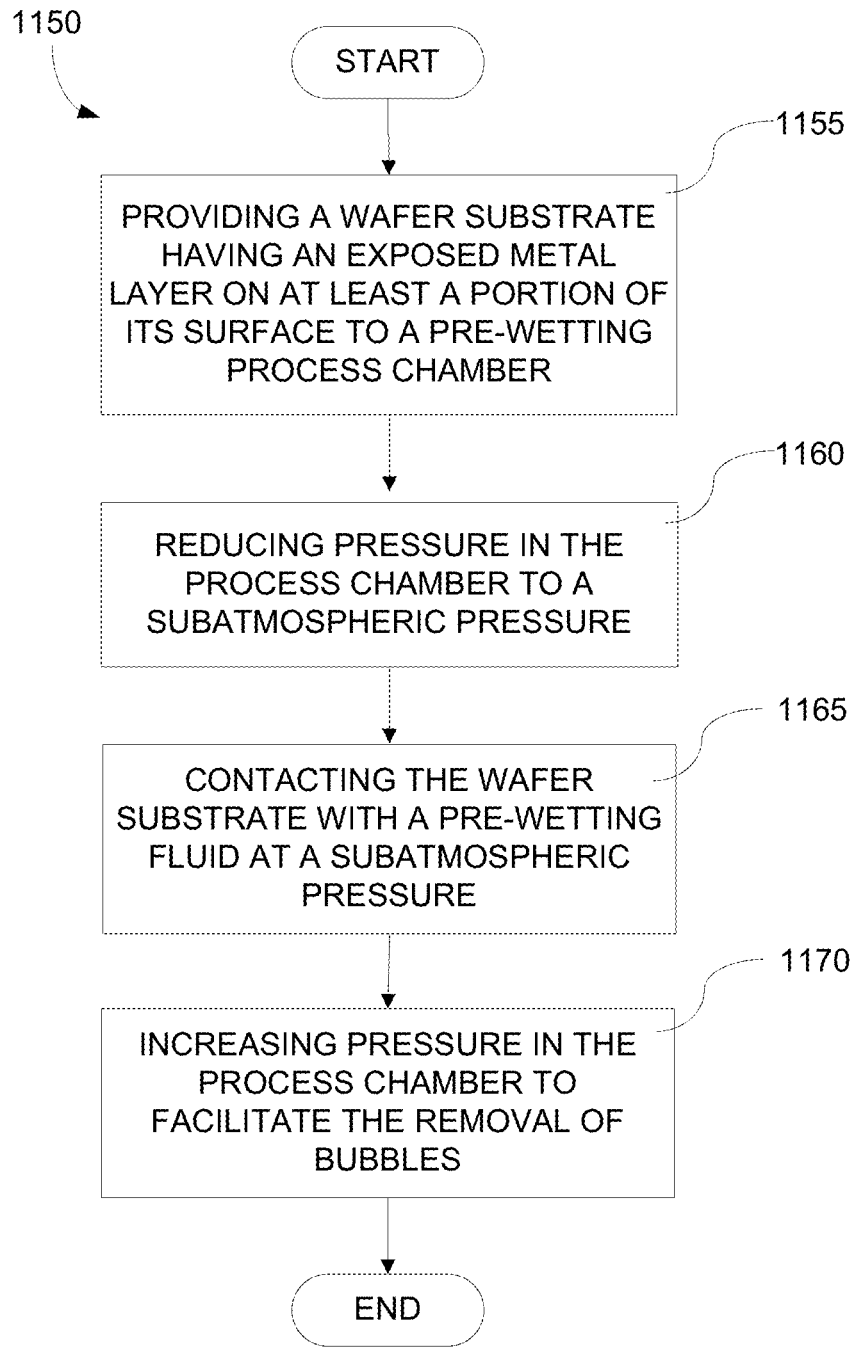

FIG. 11b is a flow diagram for another embodiment of a pre-wetting process (1150). A wafer substrate having an exposed metal layer on at least a portion of its surface is provided to a pre-wetting process chamber (1155). The pressure in the process chamber is then reduced to a subatmospheric pressure (1160). The wafer substrate is then contacted with a pre-wetting fluid at a subatmospheric pressure (1165). The pressure in the process chamber is then increased to facilitate the removal of bubbles (1170). Such a pre-wetting process can be preformed in pre-wetting apparatus designs described herein The apparatus designs and methods described herein may be used to pre-wet a partially fabricated semiconductor device structure. In some embodiments, a pre-wet partially fabricated semiconductor device structure includes at least one recessed feature. The recessed feature has a layer of metal lining the feature. The recessed feature also includes a substantially gas-free pre-wetting fluid filling the feature, the pre-wetting fluid comprising an aqueous metal salt solution substantially free from plating accelerators and levelers.

Figure 12:
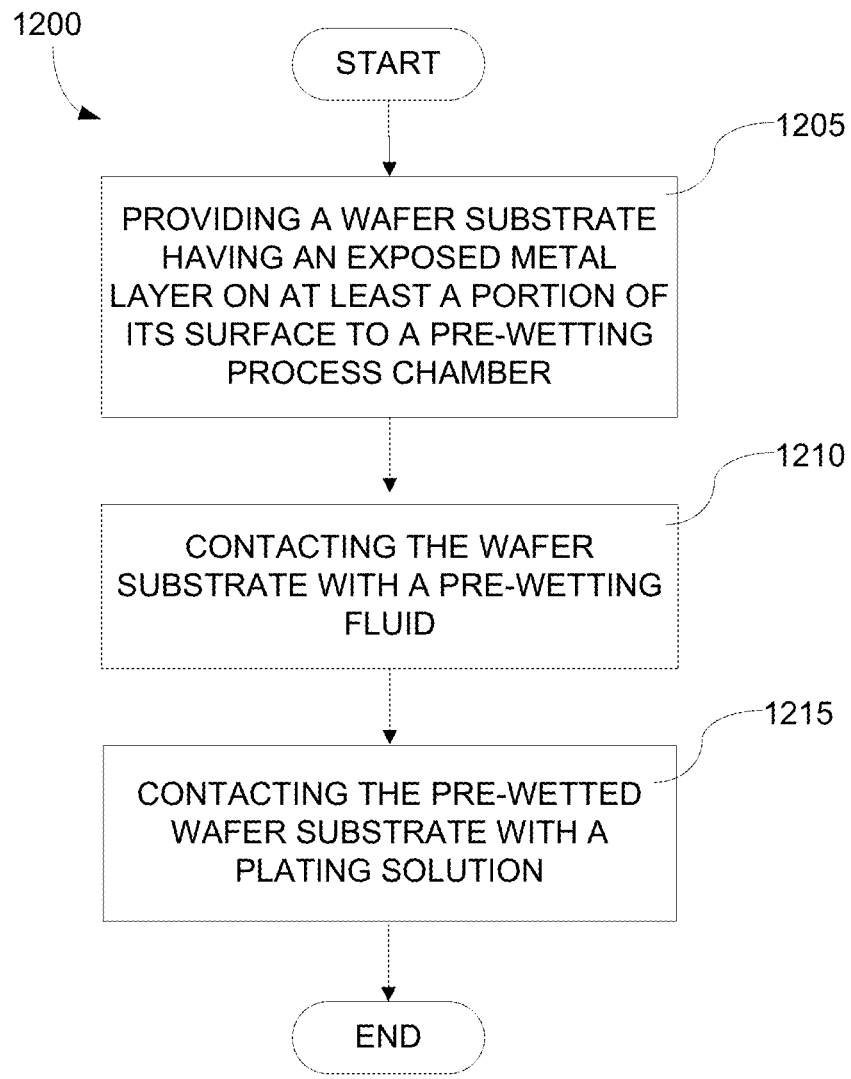
FIG. 12 is a flow diagram for an embodiment of an electroplating process for electroplating a layer of metal on a wafer substrate.

Different combinations of pre-wetting fluid compositions and plating solution compositions can be used in a pre-wetting process combined with an electroplating process, as described herein. FIG. 12 is a flow diagram for an embodiment of an electroplating process 1200 for electroplating a layer of copper on a wafer substrate. A wafer substrate having an exposed metal layer on at least a portion of its surface is provided to a pre-wetting process chamber (1205). The wafer is then contacted with a pre-wetting fluid to form a layer of pre-wetting fluid on the wafer substrate (1210). The pre-wetted wafer is then contacted with a plating solution that includes metal ions to electroplate a layer of metal on the wafer substrate (1215).

The apparatus designs and methods described herein are useful in various other liquid semiconductor processes and circumstances, beyond electroplating/feature filling, where bubbles or trapped gasses within a high aspect ratio feature may pose a problem.

All operations described herein, including the various wetting, pre-wetting, degassing, alignment, transfer, and plating operations, may be configured or programmed in one or more controllers provided on or otherwise in communication with the described modules and systems. Any combination or sequence of such operations, as described herein, may be programmed or configured as such using such controller(s). Firmware, software macros, application specific integrated circuits, shareware, and the like may be used to implement the controller instructions.

Chemistry of the Pre-Wetting Fluid

By properly controlling the chemistry of the pre-wetting fluid, further benefits of the pre-wetting process described herein may be realized, including a 50% or greater reduction in the filling time of a feature with a metal. Furthermore, the feature filling process may start significantly more rapidly, reflected by the fact that under similar conditions (i.e., the same conditions, with the exception of the composition of the pre-wetting fluid), the amount of metal deposited selectively at the bottom of the feature in the same time is much greater. With particular organic and inorganic additive combinations to the pre-wetting fluid, the pre-wetting process allows for an excellent side wall and field (field refers to wafer substrate regions that are flat and outside of features) metal growth selectivity versus bottom of a feature metal growth selectivity, allowing for high rate selective deposition with greater than an order of magnitude relative plating rate/growth at the feature bottom versus the upper side walls and field. The selectivity achieved by controlling the chemistry of the pre-wetting fluid allows for bottom-up, often plug-fill, growth and the ability to rapidly fill, without voiding, high aspect ratio features.

Historically, a number of different plating bath solutions used to deposit copper have been used to meet various needs/goals. Copper sulfate and copper methane sulphonate are the most commonly used metal salts for electroplating copper, particularly in the integrated circuit industry. The acid copper fluoroborate bath (mixture of copper and fluoroboric acid with boric acid), with its high solubility of copper and potential for high deposition rates, is also used, but has largely fallen out of favor and replaced by the methane sulphonate system (which also has high copper solubility), at least in part because of the tendency for the $BF_4^-$ anion to decompose and form hazardous HF. Alkaline copper cyanide and copper pyrophosphate baths have also been widely used, with cyanide baths having generally good plating performance, but have fallen out of favor for toxicity and stability reasons.

While the scope of this description is not limited to electroplating of s specific metal, or to specific plating solution and pre-wetting fluid combinations described in the examples, electroplating of copper in plating solution baths containing copper sulfate and/or copper methanesulphonate will be used as an illustration of specific embodiments. It is understood that embodiments disclosed herein can be employed for deposition of metals other than copper, such as nickel, iron, gold, silver, tin, lead, zinc, as well as copper and other metal co-deposited alloys (e.g., various solders such as lead-tin and silver-tin, or magnetic alloy materials containing iron, cobalt, and nickel). It is also understood that in copper electroplating, a variety of other salts beyond copper sulfate and copper methanesulphonate may be used.

Copper sulfate and methanesulphonic acid plating bath solutions typically contain three or more materials (so called plating "additives") in small concentrations (10 ppb to approximately 1000 ppm) that affect the surface electrodeposition reactions. Typically, additives include accelerators (mercapto containing species, for example; also referred to as brighteners), suppressors (typically polymers such as polyethylene glycol, for example; also referred to as carriers), levelers, and halides (e.g., chloride ion and bromide ion), each having a unique and beneficial role in creating a copper film with desired micro- and macro-characteristics.

The pre-wetting fluid and plating solution compositions described herein may be used with any of the apparatus designs or methods. For example, the pre-wetting fluid and plating solution compositions are able to be used with the methods described in FIGS. 11a, 11b, and 12.

There are several different categories of process interactions which should be considered in selecting the optimal pre-wetting fluid for a wafer substrate. These various issues are discussed herein, along with the presumed or measured examples of their effect on feature filling.

One consideration is that the surface tension of the pre-wetting fluid should be sufficiently compatible with the wafer substrate surface (e.g., hydrophilic) so that the entire surface remains covered with pre-wetting fluid from the period after the pre-wetting fluid is applied to the surface under vacuum and the time the wafer is moved to and is immersed into the plating bath. In some embodiments, the pre-wetting layer, just before immersion into the plating solution, is thin (e.g., about 50 to 500 µm thick) and uniform. By the film being thin, the amount of concentration increase or dilution/modification of the plating bath concentrations is kept small, and the film has a minimal delay in adsorption of plating additives to the general plating surface (i.e., field region). By the film thickness being uniform, the uniform transition from the state of being covered with a solution of pre-wetting fluid composition to plating bath solution composition is possible and much more easily controllable.

Another consideration is that when transferring the wafer from a pre-wetting station to a plating station, the features are filled and the general surface is coated with the pre-wetting fluid. During the ensuing time between the initial exposure of the surface to the plating solution and the initiation of plating, various unfavorable reactions with the constituents of the pre-wetting fluid, either alone, or in combination with gasses, coming from the atmosphere, may occur. By degassing the pre-wetting fluids (e.g., by using a degasser, as described herein), those reactions that involve dissolved gasses may be reduced or eliminated. Still, if and when the liquid surface layer of the pre-wetted wafer is exposed to air, gas re-adsorption into the degassed pre-wetting fluid will occur (e.g., after 15 seconds or more), and may lead to deleterious corrosion or other effects. Alternatively, with an appropriate choice of components included in the composition of the pre-wetting fluid and/or timely/rapid wafer transfer to the plating cell, such reaction and effects may be reduced or altogether avoided.

In general, a reaction between the pre-wetting fluid and the seed layer on a wafer results from the existence of a chemical driving force (i.e., a negative free energy for reaction) with moderate activation energies. Eliminating the driving force, or inhibiting the kinetics, can forestall a deleterious reaction. The reactions involve a combination of one or more solvents (e.g., water, alcohols, carbonates, or ketones), pre-wetting fluid solutes (e.g., acids, inorganic salts, organic electrolytic or neutral plating additive species), and dissolved gasses.

An example of a particularly deleterious reaction is the corrosion reaction of the metal seed layer. The seed corrosion rate will depend, for example, on parameters such as the pre-wetted wafer transfer time, the temperatures of the pre-wetting fluid and plating solution bath, the choice of pre-wetting solvent(s), the pH of the pre-wetting fluid, the particular dissolved constituents in the pre-wetting fluid, and any spatial and time-varying distribution or redistribution (i.e., concentration difference due to the diffusion into or out of the features) during the initial immersion of the wafer into the plating solution bath. These different reactions are described herein.

Any electrolytic reaction for the corrosion of a metal can be represented as two half-reactions, coupled by the transfer of an electron in the metal. For example, the reduction of oxygen or other oxidizing agent in the solvent (the element that is reduced) couples with the oxidation of copper metal. The reaction of copper metal with oxygen occurs in two steps, to cuprous ion, and depending on the solvent environment, presence of complexing agents, and pH, to cupric ion.

$$Cu \rightarrow Cu^+ + e^- \rightarrow Cu^{+2} + e^- \tag{8}$$

The reduction reactions of oxygen, written for either acid or alkaline conditions, are $$O_2 + 4H^+ + 4e^- \rightarrow H_2O \tag{9a}$$

$$O_2 + 2H_2O + 4e^- \rightarrow 4OH^- \tag{9b}$$

Using an oxygen free pre-wetting fluid prevents reaction 9a or 9b from occurring altogether, and hence the corrosion of copper is prohibited from this source. Therefore, removal of oxygen from the pre-wetting fluid is desirable in some embodiments. However, if oxygen is reintroduced into the electrolyte from the environment (e.g., during a transfer from the pre-wetting location to the plating solution), reaction 9a or 9b is again allowed to occur. Similarly, if the supply of protons is small (e.g., a pH of greater than about 3), reaction 9a will be reduced.

Figure 13:
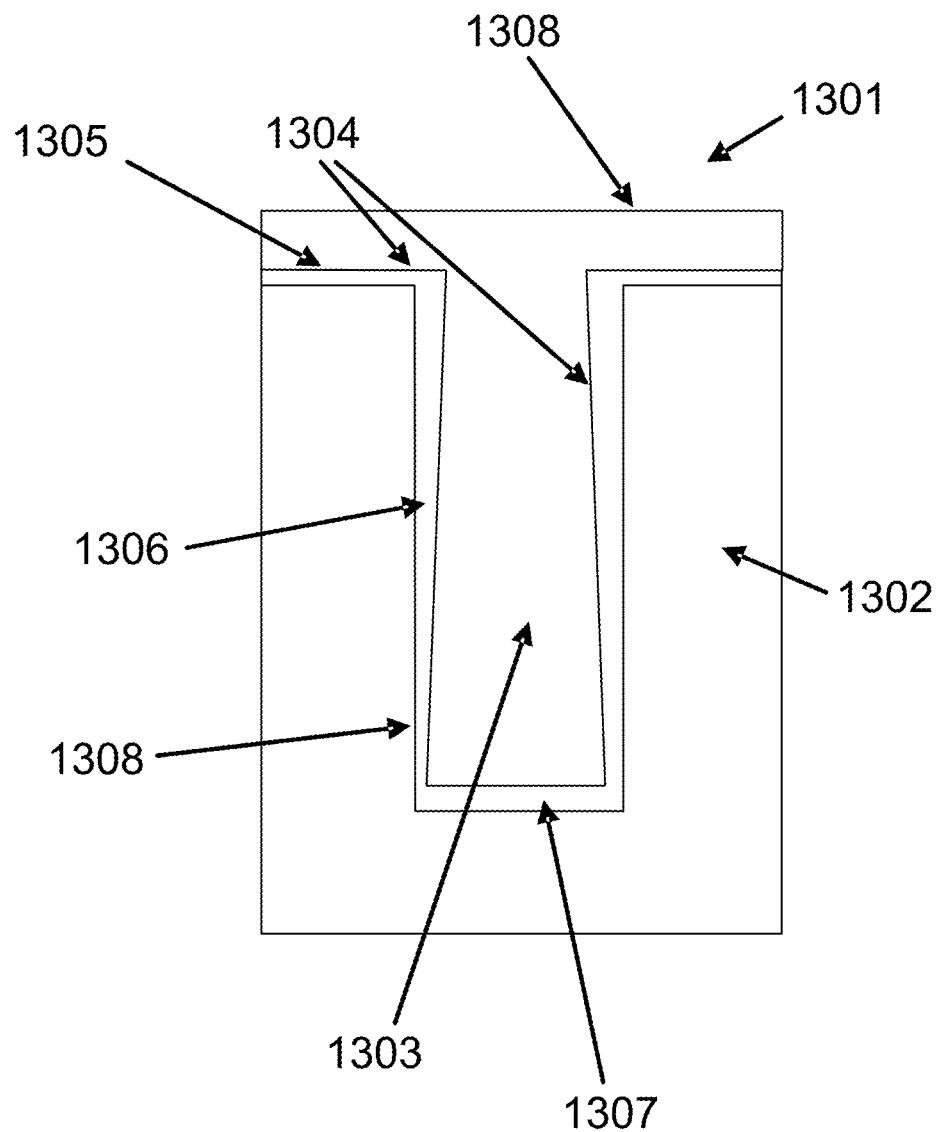
FIG. 13 depicts a wafer substrate with a feature filled with pre-wetting fluid.

Referring to an example situation depicted in FIG. 13, a structure 1301 in a wafer substrate 1302 consists of a cavity filled with pre-wetting fluid 1303. The feature surface 1305, walls 1306 and bottom 1307 of the structure are typically coated with a barrier layer (not shown) below an electroplateable "seed layer" (e.g., copper, 1304). The thickness of the metal along the walls, particularly on the lower wall 1308, is typically much thinner than that on the surface 1305 (and often also thinner than that at the feature bottom 1307) due to the nature of the seed deposition process (e.g., PVD). Initially, a degassed pre-wetting fluid 1303 is introduced to the surface under vacuum that contains no bubbles and little or no dissolved gas (e.g., oxygen). However, some gas may subsequently be introduced into the liquid from the atmosphere during the transfer of the wafer, with a near saturated condition created at the exposed liquid layer surface 1308. With a much shorter diffusion distance and resistance to arriving at the surface 1305, oxygen reduction reaction 9a will preferentially start to occur there first. While reaction 8 may occur anywhere along the surface, the reaction may preferentially occur at point on the surface where it is roughest and its effect is most detrimental where the film is thinnest (with a potential for loss of all seeded metal). Also, the metal corrosion half reaction may occur preferentially at locations where the oxygen reduction reaction is not co-occurring, such as at deep inside the feature (e.g., at locations 1307 and 1308). The overall reaction is completed by having the electrons created by reaction 8 inside the feature traveling through the metal along the wall to the feature top and field, where they combine with the oxygen via reaction 9a or 9b. The walls may be rough on a microscopic scale due to the feature creation method (e.g., from a repetitions application of a $SF_6$ isotropic RIE etch/$C_4F_8$ passivation sequence known as an Advance Silicon Etch or the "Bosche" process) and/or the deposition process. Rough metal surfaces tend to have a higher local electrochemical activity, so corrosion will be greater at rough metal surfaces than for a uniform smooth surface. These phenomena will increase the driving for metal loss from these rough metal surfaces. See, for example, a discussion of these phenomena in U.S. Pat. No. 6,946,065.

In some embodiments, a substantially non-conductive (i.e., non-ionic and electrolyte free) solvent can be effectively used for pre-wetting fluid for a pre-wetting process performed under vacuum. This is despite factors that otherwise would lead one to avoid the use such a fluid. One such conceptually negative factor is that the conductivity of such a pre-wetting fluid is quite small. At the time immediately after immersion of a wafer into a plating bath solution, deposition at the bottom of the feature filled with a non-conductive or low conductivity solvent is expected to be hindered by the inability to support plating because of its inability to support ionic current flow. Another potentially detrimental factor is the formation, after entry of a wafer into an electroplating bath, of a potential and the establishment of an internal corrosion cell due to the different activities of dissolved metals at the wafer surface and within the feature. The electrochemical potential difference in the solution, between the bottom of the feature and the top of the feature can be expressed by a form of the Nernst equation:

$$\Delta V = \frac{RT}{nF} \ln \frac{C(\text{feature})}{C(\text{surface})} \tag{10}$$

In equation 10, R is the universal gas constant, T is the absolute temperature, n is the number of electrons for the corrosion reaction, F is Faraday's constant, and C(feature) and C(surface) are the concentrations of metal ions at the two locations. A concentration cell is created, with the corrosion driving potential created by a difference in concentrations as given by equation 10. When using a pre-wetting fluid free of dissolved metal ions, the bottom of a feature will encounter a C(feature) concentration that is smaller than the C(surface) for some period of time after immersion into the plating bath containing metal ions. Therefore, a corrosive potential difference will exist between location the bottom of a feature and the surface, with the corrosion potential causing the metal on the walls and bottom of the feature to preferentially oxidize, release electrons, and complete the cycle by combining with the metal ions from the solution at the surface.

Specifically, the reaction $$Cu^{++} + 2e^- \rightarrow Cu \tag{11}$$

will occur at the surface region, and will be coupled with the oxidation reaction $$Cu \rightarrow 2e^- + Cu^{++} \tag{12}$$

occurring on the walls and lower surface at the bottom of the feature. To avoid this undesirable process when using this type of pre-wetting fluid, it is important to establish a cathodic (plating) polarization of the wafer surface versus the plating solution prior to, or very shortly after, immersion of the wafer surface into the plating solution. (See U.S. Pat. Nos. 7,211,175, 6,562,204 and 6,551,483, which deal with entry cathodic protection and potentiostatic entry, herein incorporated by reference in relevant part.) This is accomplished by applying a cathodic potential difference or a small cathodic current between the wafer and the solution before wafer bath entry. Alternatively, or additionally, in some embodiments, a rapid rinse of the wafer surface with a solution having a relatively low metal ion concentration can be used (e.g., DI water), followed by a high speed spin or other method to remove the surface solution. This process reduces the concentration of the metal at the surface relative to that in the feature, but also removes electrolyte from the wafer edge, reducing the propensity for that electrolyte to be plated on the edge of the wafer and plating apparatus contacts (e.g., when plating in a closed or seal contact "plating cup"). As another alternative, the metal ion concentration in the pre-wetting solution can be at least equal to or greater than that of the subsequent plating bath.

Examples of embodiments of pre-wetting fluids of the substantially non-conductive class are an electrolyte-free isopropyl alcohol or other water soluble non-aqueous solvents (i.e., water-miscible solvents). Other embodiments include alcohols, a dialkylcarbonate, dimethylformamide, and dimethyl sulfoxide. Another embodiment is a solution of water containing a small concentration of the non-metal-complexing tetramethylammonium sulfate and/or tetramethylammonium hydroxide, in the pH range between about 3.5 and 11.5. Still another embodiment is a solution of water containing a surfactant such as the anionic surfactant laurilsulfate (with an alkali metal cation or tetramethylammonium cation). Pre-wetting fluids that have a reduced surface tension compared to water, relatively small conductivities (e.g., compared to acids or strong bases), and are non-copper complexing are used in some embodiments.

In some embodiments of an electroplating process 1200 for electroplating a layer of metal on a wafer substrate shown in FIG. 12, a wafer substrate having an exposed metal layer on at least a portion of its surface is provided to a pre-wetting process chamber (1205). The wafer is then contacted with a pre-wetting fluid to form a layer of pre-wetting fluid on the wafer substrate (1210). The pre-wetting fluid includes a water-miscible solvent. The water miscible solvent may be an alcohol, ketone, dimethylcarbonate, diethylcarbonate, dimethyl sulfoxide, or dimethyl formamide. The pre-wetted wafer is then contacted with a plating solution that includes metal ions to electroplate a layer of metal on the wafer substrate (1215). In some embodiments, the plating solution includes copper ions to electroplate a layer of copper on the wafer substrate.

To elaborate, because the half oxidation reactions (e.g., reactions 8 and 9) must complete an electrical circuit and therefore pass ionic electrical current between the two locations where oxidation and reduction reactions are occurring, in some embodiments it is advantageous to use a pre-wetting fluid that has a small ionic conductivity, such as a low conductivity solvent that itself will not react directly with copper, or a solvent substantially free of ionically disassociated and conductive ions (i.e., dissolved acid, bases, and salts). Many water soluble solute free solvents, such as DI water, isopropyl alcohol, ethylene glycol, propylene glycol, propylene carbonate, etc., have high electronic resistances when free of solutes, and the solubility of the cupric or cuprous ion in a neutral pH solvent in the same are also generally very small. Because of these factors, corrosion of the metal in these solvents can only occur by the direct oxidation with dissolved oxygen, generally a very slow process at ambient temperature and oxygen concentrations:

$$Cu + \tfrac{1}{2}O_2 \rightarrow Cu_2O \qquad (13)$$

Therefore, performing pre-wetting using ionic-solute-free solvents (i.e., a non-electrolytic solution) such as water or DI water is one embodiment, and using deoxygenated deionized solvents such as deoxygenated DI water is another embodiment (to avoid reaction 13). In some embodiments, the plating solution is also deoxygenated/degassed prior to and during contact/exposure to the wafer surface, and a potential or current is applied to the wafer prior to entry, establishing a voltage greater than that given by equation 10, thereby preventing reaction 12 within the feature from occurring. With respect to preventing side wall corrosion, pre-wetting fluids that contain non-ionic dissolved species (e.g., non-ionic surfactants or switter-ionic surfactants, added to lower surface tension, or organic materials added to react with oxygen) are useful in some embodiments over highly conductive ionic solutes such as acids and bases. This is because of the generally lower solution specific conductance and ion current coupling of the oxidation and corrosion half reactions. An exception to this is the addition of surface adsorbing electrochemically active non-ionic materials (e.g., a non-ionic leveler compounds). A further example of an unfavorable pre-wetting fluid combination for copper plating, in some embodiments, is polyethylene glycol or polyethylene/polypropylene oxide copolymer (which are known to act as plating "suppressors") at all but very low concentrations combined with small amount of dissolved halide (e.g. chloride) ions. A suppressor without the adsorption and electrochemical activity enhancing halides appears to be unfavorable, in some embodiments, unless at very low concentrations.

In one experiment performed according to an embodiment described herein, a 60 μm deep/10 μm wide TSV via structure having a 8000 Å copper seed layer was electroplated with copper. The feature was pre-wetted with deoxygenated, deionized water. After the wafer was exposed to the atmosphere for 5 minutes, it was then transferred to a plating cell, followed by immersion into the plating solution. The plating solution was a deoxygenated plating bath sold under the trademark DVF 200™ by Enthone Inc. with added components (DVF 200™ is a copper methane sulfonate/methane sulfonic acid plating solution to which accelerators, suppressors, and leveler additives, and 50 ppm chloride ions, were added). The filling characteristics of multiple individual features across multiple runs using this method showed complete void-free feature filling in almost all cases. In some experiments, the wafers were cathodically polarized prior to entry into the plating solution. This result shows the process robustness for creating void-free bottom-up filling using a combination of a degassed DI water pre-wetting process performed under vacuum, followed by potentiostatic entry into a copper plating solution.

In other embodiments, substantially non-conductive pre-wetting fluids that contain some dissolved compounds other than metals (e.g., either electrolytic or non-ionic, organic or inorganic, added, for example, in relatively small quantities to reduce surface tensions and aid in wetting), but are substantially free of materials that are electrochemically active and/or are considered plating bath additives, are used. For example, in some embodiments, a pre-wetting fluid that is substantially free from any accelerator/brighteners or levelers (that might typically be found in a subsequently used plating bath) is used rather than those that do contain such electrochemically active agents.

In one experiment performed according to an embodiment described herein, a wafer with a 60 μm deep/10 μm wide TSV via structure having a 8000 Å copper seed layer was electroplated with copper. The feature was pre-wetted with a pre-wetting fluid containing copper methane sulfonic acid (copper salt, 80 g/L copper ion), 20 g/L methane sulfonic acid, 50 ppm chloride ion, and 3 or 12 ppm of the copper plating accelerator dimercapto-propane sulfonic acid (SPS). After pre-wetting, the wafers were exposed to the atmosphere for about 1 minute, and then transferred to a plating cell, followed by immersion into the plating solution. The plating solution was a deoxygenated plating bath sold under the trademark DVF 200™ by Enthone Inc. with additive components. Copper was then plated onto the wafer. In both cases (i.e., pre-wetted with a solution containing 3 ppm of dimercapto-propane sulfonic acid and 12 ppm of dimercapto-propane sulfonic acid), sidewall voids were formed.

In some embodiments, the pre-wetting fluid includes water and a copper salt. This helps to avoid corrosion of a seed layer due to setting up the electrochemical difference discussed in relation to equation 10. In certain embodiments, the copper salt is at a concentration of at least about 50% of a saturation limit. In certain embodiments, the copper salt is copper sulfate, a copper alkylsupphonate, and mixtures thereof. In certain embodiments, the copper salt is at a concentration greater than about 20 g/L of copper. In some embodiments, after pre-wetting the wafer substrate with a pre-wetting fluid that includes water and a copper salt, the pre-wetted wafer substrate is electroplated with copper with a copper-containing plating solution; the pre-wetting fluid contains a copper salt at a copper concentration that is the same or higher than the copper concentration in the plating solution. In some embodiments, the copper concentration in the pre-wetting fluid is at least about 25% greater than the copper concentration in the plating solution. In other embodiments, the pre-wetting fluid consists essentially of water and a copper salt.

In some embodiments, a pre-wetting fluid having the same or a very similar composition to that of the plating solution (i.e., a solution having the same metal salts and/or the same metal ion concentrations, the same acids and/or the same acid concentration(s), the same halides and/or the same concentrations of halides, and the same additives and/or the same concentrations of additives) is used. In embodiments when the pre-wetting fluid and the plating solution have the same composition, a layer of metal may be plated on the wafer substrate in the same chamber as used for pre-wetting. However, when a seed layer is marginal (e.g., rough and thin within the feature), such a pre-wetting fluid (i.e., the same or very similar to the plating solution) may be susceptible to feature fill voiding due to seed corrosion from the pre-wetting fluid. The feature rate of filling may also be improved by using a different solution for pre-wetting than that of the plating bath, as described herein.

In one experiment performed according to an embodiment described herein, a 60 μm deep/10 μm wide TSV via structure having a 8000 Å copper seed layer was electroplated with copper. The feature was initially pre-wetted with a plating solution (i.e., the pre-wetting fluid had the same composition as the plating solution). The feature/wafer was pre-wetted via a pre-wetting process performed under vacuum described herein with commercially available deoxygenated plating bath sold under the trademark DVF 200™ by Enthone Inc., with plating additive components (i.e., the plating additive components used with DVF 200™ in the other experiments described herein). The surface was exposed to the deoxygenated plating bath and was then exposed to the atmosphere for either 1 or 3 minutes between release of vacuum and the transfer/immersion into the plating bath and initiation of metal deposition. The wafers were cathodically polarized immediately upon entry into the plating solution. In one case where the surface was exposed to the atmosphere for 1 minute, the feature was filled with metal and void free, with no evidence of side wall corrosion. However, features from the same wafer show that some features are not filled, typically with one side of the feature having an irregularly shaped void. This is generally believed to be associated with the loss of seed metal at the side of the feature. For a wafer prepared and processed in exactly the same fashion, except that there was 3 minutes exposure to atmospheric between release of vacuum and the initiation of plating, the feature filling was grossly incomplete. In many cases, the entire bottom of the feature was unplated. A similar trend (i.e., transition from void free to significant side wall voiding) also occurs for a fixed atmospheric exposure time, but with decreasing seed layer thickness. Therefore, the use of the plating solution as a pre-treatment solution is less than optimal in some embodiments because of its significant sensitivity to incomplete feature filling due to side wall corrosion. Particularly in situations where the seed layer thickness is quite thin, the number of side wall void-type defects increased markedly in both situations, indicating a narrow tolerance of seed layers to this pre-wetting fluid.

Referring back to reactions 8 and 9, the metal ion created by the coupling of reaction 8 with reaction 9a or 9b must be able to pass electrical (ionic) current back to the surface though the fluid, so having a solution of substantial conductivity is an unfavorable pre-wetting fluid property, in some embodiments. This is in contrast the substantial conductivity that is generally desired in a plating solution, where conductivity is tailored so as to minimize voltage drops in the solution and within the feature to facilitate the deposition process. Of particular interest is the high ionic mobility of protons, which is the highest of any cation. This property tends to impart very high conductivities to acid solutions of given molarities. Therefore, as a general rule, pre-wetting fluids having highly dissociated acids of high concentrations (e.g., those that generate a pH of less than about 2 or create greater than about 0.01 molar of free protons) are not favored in some embodiments because they facilitate corrosion reactions due to their high conductivities. Under such acidic conditions, the metal at the bottom of the feature's wall 1308 (FIG. 13) is subject to unfavorable conditions and could potentially result in the area corroding and producing a side wall without an electroplateable seed layer.

As a primary consideration, it is desirable to avoid this inside-the-feature corrosion and feature filling defects such as voiding. The combination of the high conductivity, acidity, and potentially unfavorable adsorption and reaction of additives and halide(s) with the metal can lead to, for example, feature sidewall corrosion and filling defects, as well as inhibiting or delaying the establishment of a favorable distribution of the additives on the various surfaces required for optimal feature filling rates or void free filling. Because the metal on the side wall can be thin and oxidized prior to the pre-wetting fluid exposure, a corrosion reaction involving acid or other components can lead to the loss of all the platable metal, leaving a non-plateable metal such as the copper diffusion barrier tantalum or tantalum nitride with an exposed oxide layer thereupon. Long unpolarized (cathodically protected) exposure of the surfaces to inappropriate component mixtures of the pre-wetting fluid may therefore lead to poor feature filling. Contrary to using a strongly acidic electrolyte (pH of less than about 2), using more neutral or near neutral pre-wetting fluid can limit the supply of protons for reaction 9a, reducing the corrosion rate, reducing the defectivity, and generally improving the reliability and success of the overall pre-wetting. Note that pre-wetting fluids of this description would generally not be optimal or acceptable for copper metal deposition, but they are favored for pre-wetting, in some embodiments. Solutions in the pH ranges of about 2 to 12, free of dissolved metal ion complexing anions, do not allow reactions such as 8 and 9 to occur at appreciable rates.

In some embodiments, the pre-wetting fluid includes deionized water, an acid, and a copper salt, with the pre-wetting fluid pH not lower than about 2. In further embodiments, the pH of such a pre-wetting fluid is between about 2 and 4. The acid in such embodiments may be sulfuric acid, an alkylsuphonic acid, and mixtures of these acids. The pre-wetting fluid may also include less than about 2 g/L or sulfuric acid or methane sulfonic acid in some such embodiments. In other embodiments, the pre-wetting fluid consists essentially of water, an acid, and a copper salt, with the pre-wetting fluid pH greater than about 2. In yet other embodiments, the pre-wetting fluid includes water and an acid, and the pre-wetting fluid has a pH of greater than about 2.

According to the various published pH/potential stability diagrams and calculations (also known as Pourbaix diagrams), exposure of copper metal to a non-complexing electrolytic solution of about pH 3 or greater and further having an oxidizing source (such as dissolved oxygen) is expected to form a metal surface oxide. The formation of the oxide instead of a dissolved metal salt of copper may inhibit further oxidation. It is thermodynamically favored for cuprous ions formed at the interface to react with water or hydroxide directly to form cuprous oxide or hydroxide (rather than form dissolved cuprous or cupric salts).

$$2Cu + 4OH^- \rightarrow Cu_2O + H_2O + 4e^- \quad (15a)$$

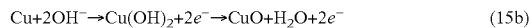

$$Cu + 2OH^- \rightarrow Cu(OH)_2 + 2e^- \rightarrow CuO + H_2O + 2e^- \quad (15b)$$

At a very high pH, the hydroxide of copper is slightly soluble, so this condition is slightly unfavorable from this prospective. The coupling of the copper oxidation half reaction with the oxygen reduction reaction may be reduced in a neutral solution, and so pre-wetting fluids free of copper complexing agents in a pH range of from about 2 to 12, more particularly between about 3.5 to 10.5, are useful classes of pre-wetting fluids for use under vacuum. Pre-wetting fluids of this class are solutions that may contain some dissolved compounds (both electrolytic and non-ionic, organic or inorganic, for example, to reduce surface tensions and aid in wetting), but are substantially free of materials that electrochemically alter the plating of the metal and active and/or are considered plating bath additives. The presence of a copper complexing agent also changes conditions, allowing the formation of a complex instead of the passivating oxide/hydroxides; if oxygen is present, unfavorable high rate corrosion is expected in metal complexing agent containing solutions having a dissolved oxidizer. Some materials that are typically bath additives can form metal complexes, such as mercapto-group containing brighteners/accelerators (e.g., mercapto-propanesulfonic acid, di-mercaptopropane sulfonic acid, etc.) and various nitrogen group containing levelers (e.g., diazine black and Janus Green B). For example, a pre-wetting fluid that does not contain any brighteners or levelers that might typically be found in a subsequently used plating bath may avoid related pre-wetting seed metal corrosion. Suppressors such as polyethers (e.g., polyethylene glycol, polypropylene oxide, etc.) or metal ion complexing agents by themselves are not particularly corrosive, and since they tend to reduce the surface tension as wetting agents, can be added when high rate fill is not a primary concern. However, the addition of suppressor in combination with chloride ions, generally considered a necessary co-constituent to achieve suppressor electrochemical activity, is not favored in some embodiments.

In some embodiments, the pre-wetting fluid may aid in removing the oxide surface. In some embodiments of an electroplating process 1200 for electroplating a layer of metal on a wafer substrate shown in FIG. 12, a wafer substrate having an exposed metal layer on at least a portion of its surface is provided to a pre-wetting process chamber (1205). The pressure in the pre-wetting process chamber is then reduced to a subatmospheric pressure (not shown). The wafer is then contacted with a pre-wetting fluid to form a layer of pre-wetting fluid on the wafer substrate (1210). In one embodiment, the pre-wetting fluid includes an acid to at least partially remove surface oxide from the seed layer and the pre-wetting fluid has a pH of between about 2 to 6. The pre-wetted wafer is then contacted with a plating solution that includes metal ions to electroplate a layer of metal on the wafer substrate (1215). The plating solution has a pH of between about 2 to 6 and the plating solution and the pre-wetting fluid have different compositions.

In other embodiments, the pre-wetting fluid may aid in transforming a metal oxide laden surface to a metallic surface (e.g., cuprous or cupric oxide—see reactions 6 and 7 and the associated discussion) or in removing the oxide surface. In some embodiments of an electroplating process 1200 for electroplating a layer of metal on a wafer substrate shown in FIG. 12, a wafer substrate having an exposed metal layer on at least a portion of its surface is provided to a pre-wetting process chamber (1205). The wafer is then contacted with a pre-wetting fluid to form a layer of pre-wetting fluid on the wafer substrate (1210). In one embodiment, the pre-wetting fluid includes a small amount of a reducing agent to at least partially reduce surface oxide on the seed layer. In another embodiment, the pre-wetting fluid includes a metal complexing agent to at least partially remove surface oxide on the exposed metal layer and the pre-wetting fluid has a pH of between about 4 to 12. The pre-wetted wafer is then contacted with a plating solution that includes metal ions to electroplate a layer of metal on the wafer substrate (1215).

In some embodiments, the plating solution includes copper ions to electroplate a layer of copper on the wafer substrate. In such embodiments, the exposed metal layer on the wafer substrate is generally copper or a copper alloy. Examples of reducing agents for copper include formaldehyde, glycolic acid (and salts thereof), and dimethylamine borane. When the exposed metal layer is copper, the pre-wetting fluid includes, in some embodiments, a copper complexing agent to at least partially remove surface oxide on the exposed copper layer and the pre-wetting fluid has a pH of between about 4 to 12.

In general, small concentrations (e.g., parts per million, typically 10 to 100 ppm) of halide ions such as chloride or bromide are present and often critical in many plating bath solutions. Halides are also well known corrosion agents. It is generally known that a solution containing halides will corrode a surface faster than an identical solution (i.e., consistent pH and ionic strength) without halides. Because they are critical in successful plating and their concentrations are low, one might assume that not having them present in the pre-wetting fluid would inhibit their uniform exposure to the features internal surfaces and thereby have a detrimental effect to the feature filling process. In some embodiments, however, it is useful to not include or add even these very low levels of halides to the pre-wetting fluids. In some embodiments, the pre-wetting fluid is substantially free from halides. Even with low, parts per million levels of halides, alone or in combination with other plating bath additives, dramatic increases in the corrosion rate of the metal on side wall features have been observed. While not wanting to be held to any particularly theory, corrosion of the metal, as a whole, is perhaps catalyzed or stabilized by the formation of cuprous halide reactants.

In one TSV feature filling experiment, similar to the other experiments described herein, performed according to an embodiment described herein, the pre-wetting fluid contained 100 g/L copper methane sulfonic acid, 16 g/L methane sulfonic acid, and either no chloride or 50 ppm of chloride ions. The copper plating was then performed using the same solution and processes as described for the other experiments described herein. Side wall seed layer corrosion was greatly exacerbated by even small quantities of halide ions in the pre-wetting fluid.

Plating bath suppressors include polyethylene glycol (PEG), polypropylene glycol (PPG), polyethylene oxide (PEO), polypropylene oxide (PPO), and various copolymers of these monomers. A suppressor is used to suppress copper plating outside the features on a wafer, allowing for copper deposition inside such features. They are also good surface tension reducing agents (surfactants), and hence, might be considered to be useful component in the pre-wetting fluid. As noted herein, the suppressive plating characteristics of these compounds are generally derived in combination with halides, and the presence of halides can cause feature side wall corrosion. In some embodiments, the pre-wetting fluid is substantially free from halides, plating accelerators, and plating levelers, and includes a plating suppressor at a small concentration (e.g., typically less than about 15 ppm).

An experiment was performed using pre-wetting fluid containing 100 g/L copper methane sulphonate, 16 g/L methane sulfonic acid (sometimes referred to as virgin makeup solution or "VMS"), no chloride ions, and various amount of an 8000 molecular weight polyethylene glycol to determine the effects of suppressors on a pre-wetting fluid. Side wall corrosion was generally not observed in these chloride-free pre-wetting fluids. Feature filling, however, was significantly impacted as the concentration of the suppressor reached somewhere between about 5 parts and 25 parts per million. The fill characteristics transitioned from a bottom-up filling at from about 0 to 5 ppm of suppressor to a bottom void at about 25 ppm suppressor. At about 50 ppm of suppressor and above, the plating was largely conformal. Thus, the use of above about 15 ppm of a suppressor is undesirable from a feature filling prospective in some embodiments.

In some embodiments of an electroplating process 1200 for electroplating a layer of copper on a wafer substrate shown in FIG. 12, a wafer substrate having an exposed metal layer on at least a portion of its surface is provided to a pre-wetting process chamber (1205). The wafer is then contacted with a pre-wetting fluid to form a layer of pre-wetting fluid on the wafer substrate (1210). The pre-wetting fluid includes water and copper ions, and is substantially free of plating additives. In this embodiment, the plating solution includes plating additives. The concentration of copper ions in the pre-wetting fluid is greater than the concentration of copper ions in the plating solution. In some embodiments, the pre-wetting fluid is substantially free of additives, including halides, accelerators, and levelers, and combinations thereof. In some embodiments, the pre-wetting fluid includes polyethylene oxide at a concentration of less than about 15 ppm. In some embodiments, plating solution additives include halides, accelerators, suppressors, and combinations thereof. The pre-wetted wafer is then contacted with a plating solution that includes copper ions to electroplate a layer of copper on the wafer substrate (1215).

In addition to the possibility of a particular pre-wetting fluid either aiding or hindering the feature filling process (e.g., the avoidance of side wall corrosion or creating a conformal type filling behavior), there is also a relationship between the composition of the pre-wetting fluid and the rate of feature filling. In experiments performed to compare the rates of feature filling, the plating bath solution composition and plating currents versus time were fixed and the amount of feature filling at the end of the process was monitored. The experiments showed that the choice of pre-wetting fluid can have a dramatic effect on the feature filling rate and time, sometimes increasing the filling rate and reducing the filling time by a factor of two or more.

While not wanting to be held to any particular explanation or model for this effect, it is believed that having a conductive electrolyte (e.g., as opposed to, for example, DI water) that principally contains significant amount of the metal salt is necessary to rapidly initiate and sustain plating at the bottom of a feature. In some embodiments, the pre-wetting fluid should not include some or all of the plating bath additives which are necessary in the field to suppress plating thereupon (i.e., levelers and suppressor). In some embodiments, the pre-wetting fluid is substantially free from plating levelers. The addition of accelerator to the pre-wetting fluid is useful in some embodiments, but accelerators (such as dimercaptopropane sulfonic acid, SPS) tend to bifurcate and form a very strongly adsorbing accelerator monomer (e.g., mercaptopropane sulfonic acid, MPS) simply by exposure of the surface to the pre-wetting fluid. This bifurcation of accelerator may be sufficiently fast that, prior to initiating plating, the entire surface is saturated with the accelerator adsorbate. Therefore, upon starting the subsequent plating, the field and upper side walls may require the accelerator to be removed or deactivated in order to cause the current to be driven into the intricacies of the features. In contrast, a pre-wetting fluid that contains metal ions, but no accelerator or other additives, will plate at a high rate upon entry in the bath until a suppressing additive become surface-active. In some embodiments, the pre-wetting fluid is substantially free from one or more of halides, plating accelerators, and plating levelers.

The smaller accelerator can diffuse quickly from the plating bath into the mouth and lower regions of a feature, while the suppressor and leveler molecules will diffuse slower and initially act primarily on the upper side walls of the feature, hence creating polarization contact and driving the current into the feature. The accelerator molecule primarily serves the purpose of deactivating, removing, or preventing the polarization developed by the suppressor/halide combination. An accelerator in itself is only a weak polarizing agent with respect to an additive free solution that is free of the polarizing suppressor/halide combination. While some halides, such as chloride, may be relatively small and diffuse with similar alacrity to the accelerator molecule, without either suppressor and leveler present at the feature bottom, the surface kinetics will still be fast and the plating resistance very low (halides alone are generally non-polarizing, and in fact some literature says they are depolarizing, by themselves). Furthermore, the ability to have the electrochemical conversion of SPS to the strongly adsorbing MPS accelerator molecule occur for some duration of time in an local environment free of suppressor (i.e., before any suppressor can arrive sets up an "inertial" plating condition that tend to reduce the propensity for the suppressor later absorb) avoids polarization and increases the relative plating to the bottom of the feature. In contrast, at the upper walls and field of the feature, very shortly after exposure to the plating solution, suppressor is adsorbed, and leveler competes with the adsorption of accelerator to remove the polarization there, so polarization develops there very rapidly. As time progresses after immersion into the plating bath, the small molecules such as the accelerator and halide will diffuse rapidly into the feature, but the larger levelers and much larger suppressor will diffuse much more slowly, delaying their inhibitive effect inside and allowing for a fast fill.

Depending on the feature size, quality of seeding inside the feature, various processing costs, and other goals, one or more pre-wetting fluids may be favored over another, in certain embodiments. Tables 1 to 4 are based a large number of feature filling experiments and observations, similar to those described herein, that qualitatively categorized and compared the propensity of feature corrosion and enhancement/retardation of feature filling (filling rate) for a number of different pre-wetting fluid combinations. The table term "EXCELLENT" indicates a generally highly favorable result (e.g., little evidence of seed corrosion or enhanced or otherwise high feature filling rate). The table term "GOOD" indicates a potentially acceptable result, though one that may not be optimal in all cases (e.g., depending on seed quality, plating baths, etc). The table term "FAIR" includes performances that are typically quite marginal or may be unreliable, and may often lead to negative or poor results. Finally, the table term "POOR" indicates almost invariably unacceptable seed corrosion or a significantly altered (e.g., conformal filling) or diminished filling rate behavior.

Results for different concentrations of acids are given. Results on metals of either sulfate or methane sulfonic acids are also given, although the difference between the two was generally found to be minimal. In tables where the labels "sulfuric or methane sulfonic" acid are given, the additional component creates a mixture of the two types of acids (not just more acid of the same chemical). For example, in Table 2, all of the pre-wetting fluids included greater than 2 g/L or either sulfuric acid or methane sulfonic acid. The pre-wetting fluid in row 1 [i.e., >2 g/L Methane Sulfonic (or Sulfuric) Acid] contained BOTH 2 g/L of sulfuric acid AND 2 g/L of methane sulfonic acid. The pre-wetting fluid in row 2 [i.e., <2 g/L Methane Sulfonic (or Sulfuric) Acid] contained EITHER 2 g/L of sulfuric acid OR 2 g/L of methane sulfonic acid. Sulfuric acid has about the same molecular weight as methane sulfonic acid, so the concentrations are about the same in the two cases, but it is recognized that sulfuric acid is both diprotic and has a different dissociation constant ($H_2SO_4$: MW=98, $pKa_1$=3.0, $pKa_2$=2; $CH_3SO_3H$: MW=96, pKa=1.9), so the pH of a solution containing the same amount of sulfuric acid will be lower. Finally, the concentrations of the copper solutions from different salts are in grams per liter of cupric ions ($Cu^{++}$), not of the anhydrous salt or hydrated salt.

From these tables a number general trends of good pre-wetting fluids can be identified, specifically those containing little or no acid (pH of 2 or greater), moderate to high metal ion concentrations, little or no halides (<10 ppm), less than about 15 ppm PEG like suppressors, and neither leveler or accelerator plating additive. A solution containing from 20 to 100 g/L metal ion with no other components other than solvent (water) and a small concentration of a surfactant (or no surfactant) is an example of a good pre-wetting fluid composition.

TABLE 1

Pre-wetting fluid of DI water and one other component.

| Material<br>DI water and One Other component | Feature<br>Sidewall<br>Corrosion<br>Susceptabilty | Feature<br>Bottom Up<br>Filling<br>Rate |
| --- | --- | --- |
| DI Water Only | Excellent | Fair-Good |
| >2 g/L Sulfuric Acid | Poor | Good |
| >2 g/L Methane Sulfonic Acid | Poor | Good |
| <2 g/L Sulfuric Acid | Fair-Good | Fair-Good |
| <2 g/L Methane Sulfonic Acid | Fair-Good | Fair-Good |
| <20 g/L Copper Sulfate | Excellent | Good |
| <20 g/L Copper Methane Sulfonate | Excellent | Good |
| >20 g/L Copper Sulfate | Excellent | Excellent |
| >20 g/L Copper Methane Sulfonate | Excellent | Excellent |
| >10 ppm Chloride/Bromide | Poor | Poor |
| >15 ppm Suppressor | Good | Fair |
| Accelerator | Fair | Poor |
| Leveler | Fair | Poor |

TABLE 2

Pre-wetting fluid of DI water, greater than 2 g/L sulfuric acid or methane sulfonic acid, and one other component.

| Material<br>DI water, >2 g/L Sulfuric Acid or Methane<br>Sulfonic Acid, and One Other component | Feature<br>Sidewall<br>Corrosion<br>Susceptabilty | Feature<br>Bottom Up<br>Filling<br>Rate |
| --- | --- | --- |
| >2 g/L Methane Sulfonic (or Sulfuric) Acid | Poor | Good |
| <2 g/L Methane Sulfonic (or Sulfuric) Acid | Poor | Good |
| <20 g/L Copper Sulfate | Fair | Good |
| <20 g/L Copper Methane Sulfonate | Fair | Good |
| >20 g/L Copper Sulfate | Fair | Excellent |
| >20 g/L Copper Methane Sulfonate | Fair | Excellent |
| >10 ppm Chloride/Bromide | Poor | Poor |
| >15 ppm Suppressor | Good | Fair |
| Accelerator | Poor | Poor |
| Leveler | Poor | Poor |

TABLE 3

Pre-wetting fluid of DI water, less than 2 g/L sulfuric acid or methane sulfonic acid, and one other component.

| Material<br>DI water, <2 g/L Sulfuric Acid or Methane<br>Sulfonic Acid, and One Other component | Feature<br>Sidewall<br>Corrosion<br>Susceptabilty | Feature<br>Bottom Up<br>Filling<br>Rate |
| --- | --- | --- |
| >2 g/L Methane Sulfonic (or Sulfuric) Acid | Poor | Good |
| <2 g/L Methane Sulfonic (or Sulfuric) Acid | Fair-Good | Good |
| <20 g/L Copper Methane Sulfonate | Good | Good |
| <20 g/L Copper Sulfate | Good | Good |
| >20 g/L Copper Sulfate | Excellent | Excellent |
| >20 g/L Copper Methane Sulfonate | Excellent | Excellent |
| >10 ppm Chloride/Bromide | Poor | Poor |
| >15 ppm Suppressor | Good | Fair |
| Accelerator | Fair | Poor |
| Leveler | Fair | Poor |

TABLE 4

Pre-wetting fluid of DI water, less than 2 g/L sulfuric acid or methane sulfonic acid, greater than 20 g/L copper sulfate, and one other component.

| Material<br>DI water, <2 g/L Sulfuric Acid (or Methane Sulfonic Acid), >20 g/L Copper Sulfate, and One Other Component | Feature<br>Sidewall<br>Corrosion<br>Susceptabilty | Feature<br>Bottom Up<br>Filling<br>Rate |
|---|---|---|
| >2 g/L Sulfuric (or Methane Sulfonic) Acid | Fair | Excellent |
| <2 g/L Sulfuric Acid (or Methane Sulfonic) Acid | Good | Excellent |
| <20 g/L Copper Methane Sulfonate | Excellent | Excellent |
| >20 g/L Copper Methane Sulfonate | Excellent | Excellent |
| >10 ppm Chloride | Poor | Poor |
| >15 ppm Suppressor | Excellent | Fair |
| Accelerator | Fair | Poor |
| Leveler | Fair | Poor |

CONCLUSION

Although the foregoing apparatus designs and methods have been described in some detail for purposes of clarity of understanding, it will be apparent that certain changes and modifications may be practiced within the scope of the appended claims. It should be noted that there are many alternative ways of implementing both the process and compositions described herein. Accordingly, the present embodiments are to be considered as illustrative and not restrictive, and embodiments are not to be limited to the details given herein.

What is claimed is:

1. A method of electroplating a layer of copper on a wafer substrate, the method comprising:
   (a) providing the wafer substrate having an exposed metal layer on at least a portion of its surface to a pre-wetting process chamber;
   (b) contacting the wafer substrate with a pre-wetting fluid under subatmospheric pressure, the pre-wetting fluid comprising water and copper ions, to form a layer of pre-wetting fluid on the wafer substrate;
   (c) contacting the pre-wetted wafer substrate with a plating solution, the plating solution comprising copper ions, cathodically biasing the wafer substrate and electroplating a layer of copper on the wafer substrate, wherein the concentration of copper ions in the pre-wetting fluid is greater than the concentration of copper ions in the plating solution.

2. The method of claim 1, wherein the pre-wetting fluid is substantially free of additives selected from the group consisting of halides, accelerators, and levelers.

3. The method of claim 1, wherein the pre-wetting fluid contains polyethylene oxide at a concentration of less than about 15 ppm.

4. The method of claim 1, wherein the plating solution contains an additive selected from the group consisting of halides, accelerators, levelers, and suppressors.

5. The method of claim 1, wherein the layer of pre-wetting fluid has a thickness of between about 50-500 μm immediately before contact with the plating solution.

6. The method of claim 1, wherein the copper ions in the pre-wetting fluid are from a copper salt, wherein the concentration of the copper salt in the pre-wetting fluid is at least about 50% of the saturation limit of the copper salt.

7. The method of claim 1, wherein the pre-wetting fluid has a copper ion concentration of greater than about 20 g/L.

8. The method of claim 1, wherein the pre-wetting fluid consists essentially of the water and a copper salt, wherein the copper salt is a source of the copper ions in the pre-wetting fluid.

9. The method of claim 1, wherein the concentration of the copper ions in the pre-wetting fluid is at least about 25% greater than the concentration of the copper ions in the plating solution.

10. The method of claim 1, wherein the copper ions in the pre-wetting fluid are from a dissolved copper sulfate and/or copper methanesulfonate.

11. The method of claim 1, wherein the wafer substrate provided in (a) comprises a plurality of recessed features.

* * * * *